(12) United States Patent
Subramanian et al.

(10) Patent No.: US 11,205,708 B2
(45) Date of Patent: Dec. 21, 2021

(54) DUAL SELF-ALIGNED GATE ENDCAP (SAGE) ARCHITECTURES

(71) Applicant: Intel Corporation, Santa Clara, CA (US)

(72) Inventors: Sairam Subramanian, Portland, OR (US); Walid M. Hafez, Portland, OR (US); Sridhar Govindaraju, Portland, OR (US); Mark Liu, West Linn, OR (US); Szuya S. Liao, Portland, OR (US); Chia-Hong Jan, Portland, OR (US); Nick Lindert, Portland, OR (US); Christopher Kenyon, Portland, OR (US)

(73) Assignee: Intel Corporation, Santa Clara, CA (US)

(*) Notice: Subject to any disclaimer, the term of this patent is extended or adjusted under 35 U.S.C. 154(b) by 750 days.

(21) Appl. No.: 15/943,556

(22) Filed: Apr. 2, 2018

(65) Prior Publication Data

US 2019/0305112 A1 Oct. 3, 2019

(51) Int. Cl.
| | |
|---|---|
| *H01L 29/66* | (2006.01) |
| *H01L 29/06* | (2006.01) |
| *H01L 27/088* | (2006.01) |
| *H01L 21/8234* | (2006.01) |
| *H01L 21/762* | (2006.01) |
| *H01L 21/768* | (2006.01) |

(52) U.S. Cl.
CPC ...... *H01L 29/66545* (2013.01); *H01L 21/762* (2013.01); *H01L 21/76895* (2013.01); *H01L 21/823431* (2013.01); *H01L 27/0886* (2013.01); *H01L 29/0649* (2013.01)

(58) Field of Classification Search
CPC .......... H01L 29/66545; H01L 29/0649; H01L 27/0886; H01L 21/823431; H01L 21/762; H01L 21/76895; H01L 27/0203; H01L 27/0207
See application file for complete search history.

(56) References Cited

U.S. PATENT DOCUMENTS

| | | | |
|---|---|---|---|
| 9,917,062 B1* | 3/2018 | Goktepeli | H01L 21/845 |
| 2015/0318215 A1* | 11/2015 | Taylor, Jr. | H01L 21/3083 257/506 |
| 2016/0204002 A1* | 7/2016 | Wallace | H01L 23/49827 257/773 |
| 2016/0233298 A1* | 8/2016 | Webb | H01L 27/0924 |
| 2017/0069725 A1* | 3/2017 | Bhimarasetti | H01L 21/823481 |
| 2017/0092726 A1* | 3/2017 | Nidhi | H01L 29/785 |
| 2019/0067120 A1* | 2/2019 | Ching | H01L 29/41791 |
| 2019/0067446 A1* | 2/2019 | Ching | H01L 21/823481 |

* cited by examiner

*Primary Examiner* — Karen Kusumakar
*Assistant Examiner* — Adam S Bowen
(74) *Attorney, Agent, or Firm* — Schwabe, Williamson & Wyatt, P.C.

(57) ABSTRACT

Dual self-aligned gate endcap (SAGE) architectures, and methods of fabricating dual self-aligned gate endcap (SAGE) architectures, are described. In an example, an integrated circuit structure includes a first semiconductor fin having a cut along a length of the first semiconductor fin. A second semiconductor fin is parallel with the first semiconductor fin. A first gate endcap isolation structure is between the first semiconductor fin and the second semiconductor fin. A second gate endcap isolation structure is in a location of the cut along the length of the first semiconductor fin.

21 Claims, 14 Drawing Sheets

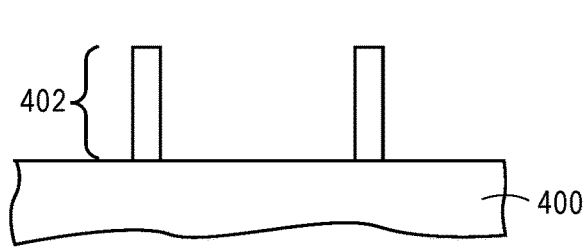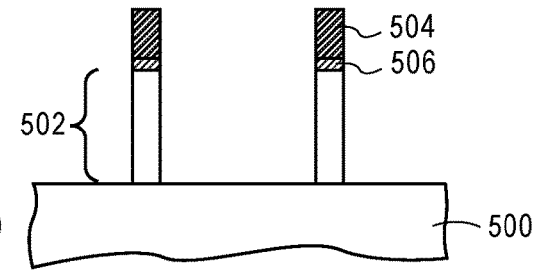
FIG. 4A  FIG. 5A
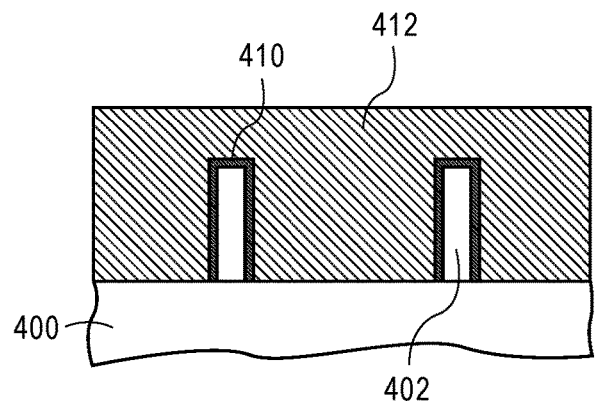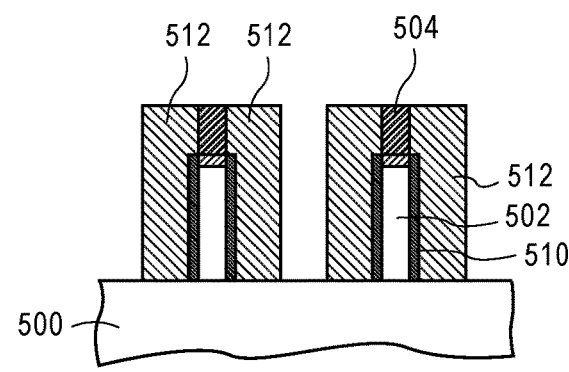
FIG. 4B  FIG. 5B ated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

DUAL SELF-ALIGNED GATE ENDCAP (SAGE) ARCHITECTURES

TECHNICAL FIELD

Embodiments of the disclosure are in the field of semiconductor devices and processing and, in particular, dual self-aligned gate endcap (SAGE) architectures, and methods of fabricating dual self-aligned gate endcap (SAGE) architectures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 4A-4D illustrate cross-sectional views of process operations of significance in a conventional finFET or tri-gate process fabrication scheme.

FIGS. 5A-5D illustrate cross-sectional views of process operations of significance in a self-aligned gate endcap process fabrication scheme for finFET or tri-gate devices, in accordance with an embodiment of the present disclosure.

DESCRIPTION OF THE EMBODIMENTS

Figure 1:
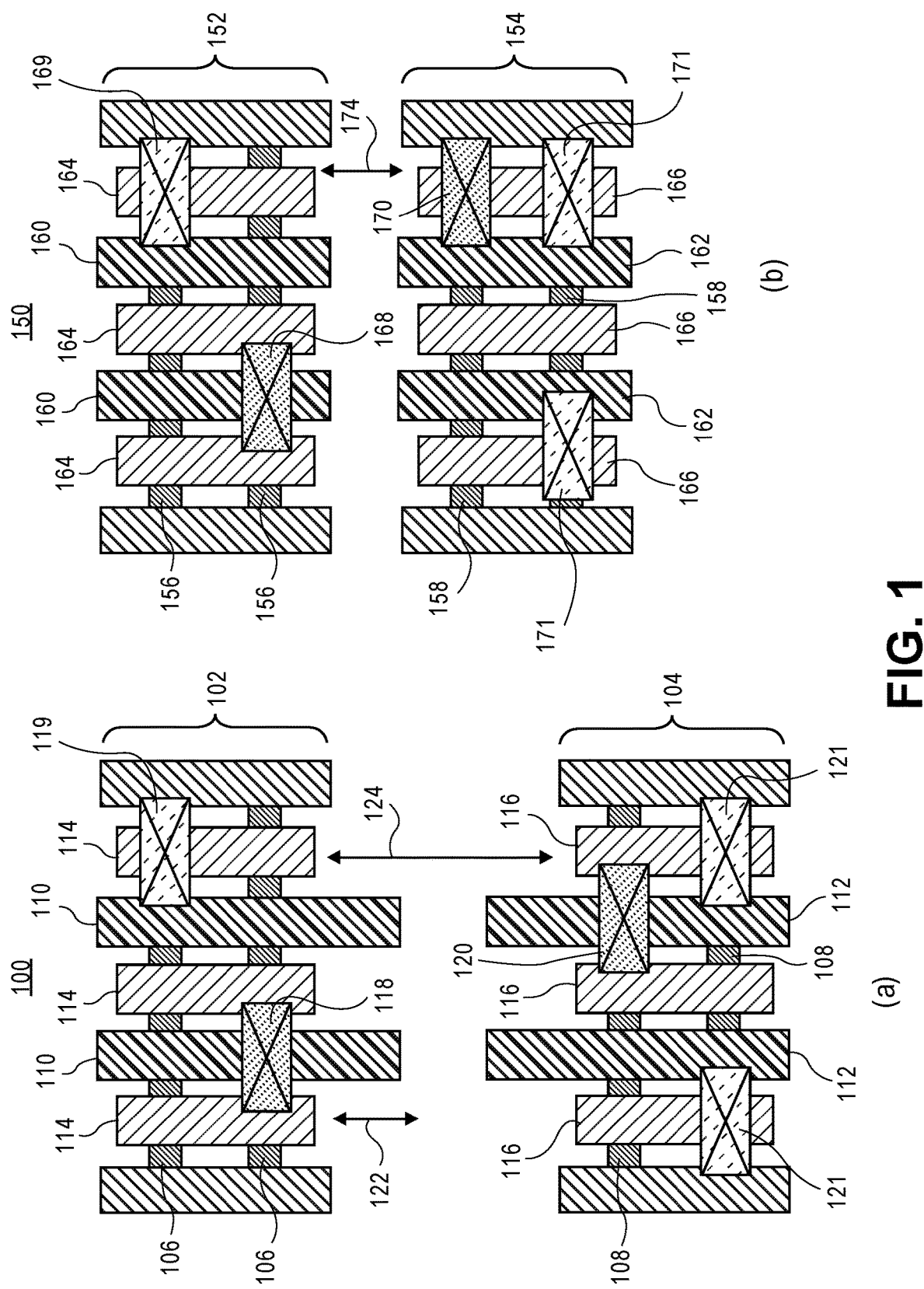
FIG. 1 illustrates plan views of adjacent integrated circuit structures for a conventional architecture with relatively wide spacing (left-hand side) versus adjacent integrated circuit structures for a self-aligned gate endcap (SAGE) architecture with relatively tight spacing (right-hand side), in accordance with an embodiment of the present disclosure.

Dual self-aligned gate endcap (SAGE) architectures, and methods of fabricating dual self-aligned gate endcap (SAGE) architectures, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present disclosure are directed to semiconductor structures or devices having one or more gate endcap structures (e.g., as gate isolation regions) of gate electrodes of the semiconductor structures or devices. One or more embodiments are directed to the fabrication of local interconnects for such gate electrode structures. Additionally, methods of fabricating gate endcap isolation structures in a self-aligned manner are also described. In one or more embodiments, unidirectional self-aligned gate endcap (SAGE) structures are fabricated both prior to and after a fin cut process, to provide an integrated circuit structure referred to in at least some contexts as a dual SAGE structure architecture. Embodiments described herein may address issues associated with scaling diffusion end-to-end spacing in an ultra-scaled process technology.

To provide context, state-of-the-art approaches have relied on lithographic scaling of the gate end to end (poly cut) to define a minimum technology gate overlap of diffusion. The minimum technology gate overlap of diffusion is a key component in diffusion end to end space. An associated gate line (poly cut) process has typically been limited by lithography, registration, and etch bias considerations, and ultimately sets the minimum diffusion end to end distance. Other approaches such as contact over active gate (COAG) architectures have worked to improve such diffusion spacing capability. However, improvements in this technology arena remain highly sought after.

In accordance with an embodiment of the present disclosure, isolating SAGE wall structures are fabricated at two different operations of a process flow. A first set of isolating SAGE wall structures is formed parallel with a plurality of fins and have positions or locations that arise from a natural fin pitch spacing. A fin cut or trim process is then performed in the presence of the first set of isolating SAGE wall structures. A second set of isolating SAGE wall structures is formed after performing fin trim cuts. The secondary wall fabrication takes into consideration the registration capabilities and pitch constraints for fin end to end dimensions.

To provide further context, current SAGE wall architecture involves the fabrication of SAGE walls that are not truly self-aligned in both x and y directions. A fin end to end spacing to wall is governed by lithography registration which renders a state-of-the-art SAGE architecture susceptible to contact to gate shorts. By contrast, in accordance with one or more embodiments described herein, a dual wall formation process provides one or more SAGE walls fabricated after fin cut and having a different endcap spacing relative to a first set of SAGE walls fabricated prior to fin cut. In an embodiment, such an architecture alleviates registration induced shorts which may arise from state-of-the-art SAGE architectures. In particular, in an embodiment, post fin trim secondary wall fabrication is performed to provide a fin-to-wall spacing adjusted to ensure a robust process window for end-cap space between fin ends and a SAGE wall formed in directions perpendicular to fin directions. In one embodiment, locations having a minimum fin pitch are excluded from having SAGE walls fabricated therein.

To provide a foundation to highlight advantages of embodiments of the present disclosure, it is first to be appreciated that advantages of a self-aligned gate endcap (SAGE) architecture over non-SAGE approaches may include the enabling of higher layout density and, in particular, scaling of diffusion to diffusion spacing. As an example, FIG. 1 illustrates plan views of adjacent integrated circuit structures for a conventional architecture with relatively wide spacing (left-hand side) versus adjacent integrated circuit structures for a SAGE architecture with relatively tight spacing (right-hand side), in accordance with an embodiment of the present disclosure.

Referring to the left-hand side of FIG. 1, a layout 100 includes first 102 and second 104 integrated circuit structures based on semiconductor fins 106 and 108, respectively. Each device 102 and 104 has a gate electrode 110 or 112, respectively. Additionally, each device 102 and 104 has trench contacts (TCNs) 114 or 116, respectively, at source and drain regions of the fins 106 and 108, respectively. Gate vias 118 and 120, and trench contact vias 119 and 121 are also depicted.

Referring again to the left-hand side of FIG. 1, the gate electrodes 110 and 112 have a relatively wide end cap region 122, which is located off of the corresponding fins 106 and 108, respectively. The TCNs 114 and 116 each have a relatively large end-to-end spacing 124, which is also located off of the corresponding fins 106 and 108, respectively.

By contrast, referring to the right-hand side of FIG. 1, a layout 150 includes first 152 and second 154 integrated circuit structures based on semiconductor fins 156 and 158, respectively. Each device 152 and 154 has a gate electrode 160 or 162, respectively. Additionally, each device 152 and 154 has trench contacts (TCNs) 164 or 166, respectively, at source and drain regions of the fins 156 and 158, respectively. Gate vias 168 and 170, and trench contact vias 169 and 171 are also depicted.

Referring again to the right-hand side of FIG. 1, the gate electrodes 160 and 162 have a relatively tight end cap region, which is located off of the corresponding fins 156 and 158, respectively. The TCNs 164 and 166 each have a relatively tight end-to-end spacing 174, which is also located off of the corresponding fins 156 and 158, respectively.

To provide further context, scaling of gate endcap and trench contact (TCN) endcap regions are important contributors towards improving transistor layout area and density. Gate and TCN endcap regions refer to gate and TCN overlap of the diffusion region/fins of semiconductor devices. As an example, FIG. 2 illustrates a plan view of a conventional layout 200 including fin-based semiconductor devices accommodating end-to-end spacing.

Figure 2:
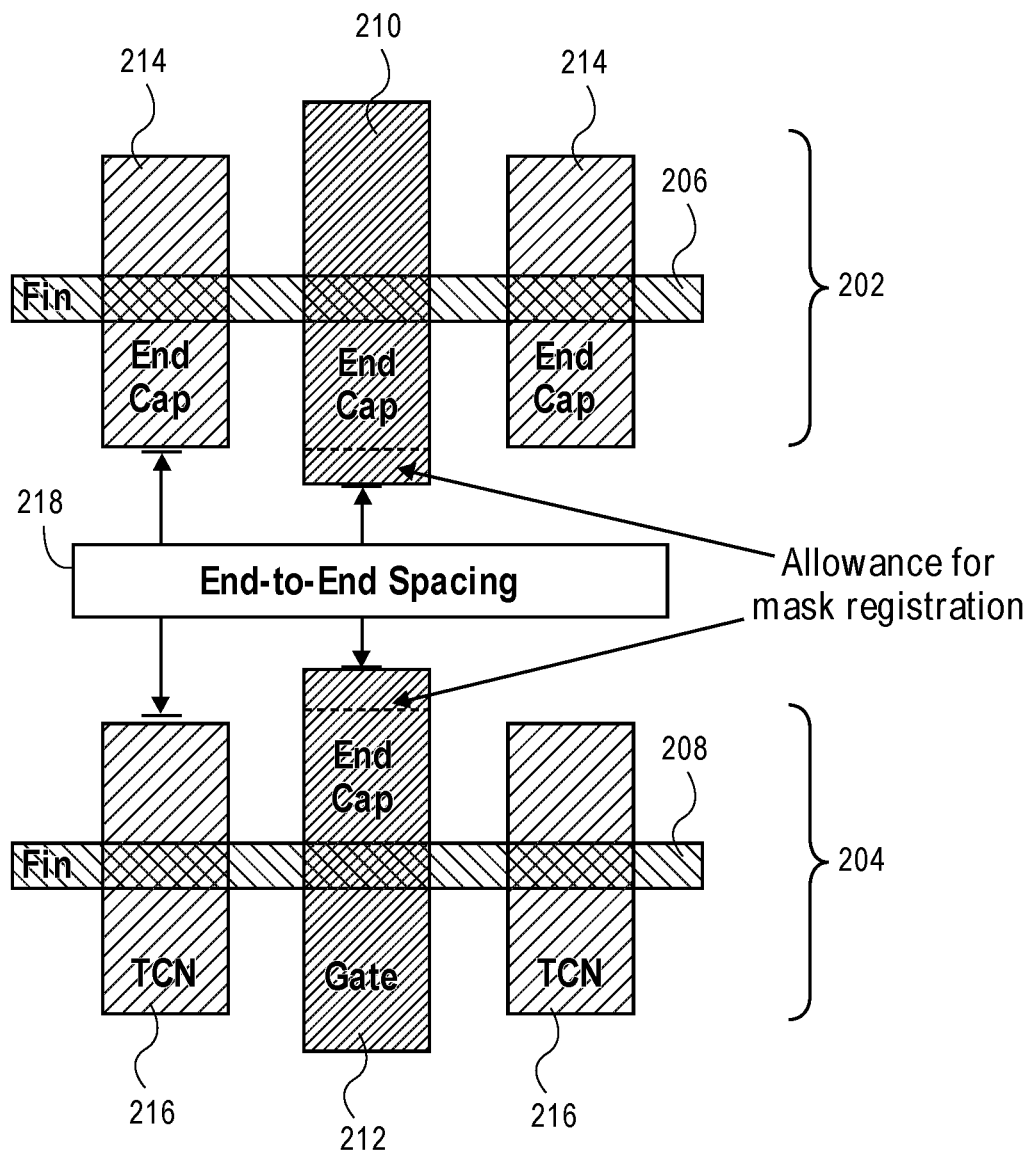
FIG. 2 illustrates a plan view of a conventional layout including fin-based semiconductor devices accommodating end-to-end spacing.

Referring to FIG. 2, first 202 and second 204 semiconductor devices are based on semiconductor fins 206 and 208, respectively. Each device 202 and 204 has a gate electrode 210 or 212, respectively. Additionally, each device 202 and 204 has trench contacts (TCNs) 214 or 216, respectively, at source and drain regions of the fins 206 and 208, respectively. The gate electrodes 210 and 212 and the TCNs 214 and 216 each have an end cap region, which is located off of the corresponding fins 206 and 208, respectively.

Referring again to FIG. 2, typically, gate and TCN endcap dimensions must include an allowance for mask registration error to ensure robust transistor operation for worst case mask mis-registration, leaving an end-to-end spacing 218. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present disclosure, approaches are described which provide for self-aligned gate endcap and TCN overlap of a semiconductor fin without any need to allow for mask registration. In one such embodiment, a disposable spacer is fabricated on the semiconductor fin sidewalls which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not necessarily require lithographic patterning at previously required stages since the gate and TCN endcap/overlap dimensions remain fixed, leading to improvement (i.e., reduction) in device to device variability in electrical parameters.

In accordance with one or more embodiments of the present disclosure, scaling is achieved through a reduction of gate endcap overlap to diffusion by constructing a SAGE wall. As an example, FIG. 3 illustrates cross-sectional views taken through fins for a conventional architecture (left-hand side) versus a self-aligned gate endcap (SAGE) architecture (right-hand side), in accordance with an embodiment of the present disclosure.

Figure 3:
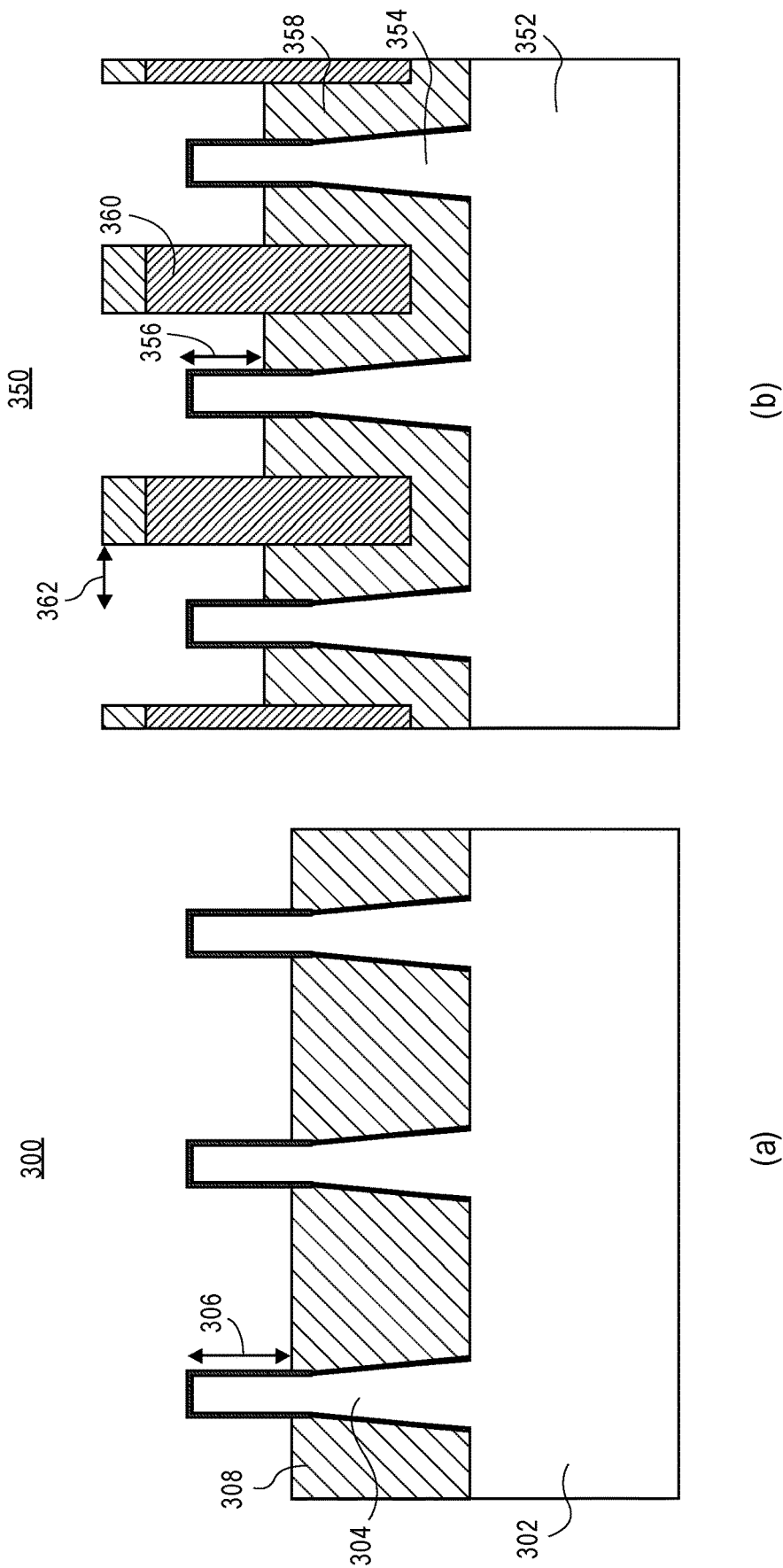
FIG. 3 illustrates cross-sectional views taken through fins for a conventional architecture (left-hand side) versus a self-aligned gate endcap (SAGE) architecture (right-hand side), in accordance with an embodiment of the present disclosure.

Referring to the left-hand side of FIG. 3, an integrated circuit structure 300 includes a substrate 302 having fins 304 protruding therefrom. A height ($H_{Si}$) 306 of an active portion of the fins 304 is set by an isolation structure 302 laterally surrounding lower portions of the fins 304. A gate structure may be formed over the integrated circuit structure 300 to fabricate a device. However, breaks in such a gate structure are accommodated for by increasing the spacing between fins 304.

By contrast, referring to the left-hand side of FIG. 3, an integrated circuit structure 350 includes a substrate 352 having fins 354 protruding therefrom. A height ($H_{Si}$) 356 of an active portion of the fins 354 is set by an isolation structure 352 laterally surrounding lower portions of the fins 354. Isolating SAGE walls 360 (which may include a hardmask thereon, as depicted) are included within the isolation structure 352 and between adjacent fins 354. The distance between an isolating SAGE wall 360 and a nearest fin 354 defines the gate endcap spacing 362. A gate structure may be formed over the integrated circuit structure 300, between insolating SAGE walls to fabricate a device. Breaks in such a gate structure are imposed by the isolating SAGE walls. Since the isolating SAGE walls 360 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 360.

In order to provide a side-by-side comparison, FIGS. 4A-4D illustrate cross-sectional views of process operations of significance in a conventional finFET or tri-gate process fabrication scheme, while FIGS. 5A-5D illustrate cross-sectional views of process operations of significance in a self-aligned gate endcap process fabrication scheme for finFET or tri-gate devices, in accordance with an embodiment of the present disclosure.

Referring to FIGS. 4A and 5A, a bulk semiconductor substrate 400 or 500, such as a bulk single crystalline silicon substrate is provided having fins 402 or 502, respectively, etched therein. In an embodiment, the fins are formed directly in the bulk substrate 400 or 500 and, as such, are formed continuous with the bulk substrate 400 or 500. It is to be appreciated that within the substrate 400 or 500, shallow trench isolation structures may be formed between fins. Referring to FIG. 5A, a hardmask layer 504, such as a silicon nitride hardmask layer, and a pad oxide layer 506, such as a silicon dioxide layer, remain atop fins 502 following patterning to form the fins 502. By contrast, referring to FIG. 4A, such a hardmask layer and pad oxide layer have been removed.

Referring to FIG. 4B, a dummy or permanent gate dielectric layer 410 is formed on the exposed surfaces of the semiconductor fins 402, and a dummy gate layer 412 is formed over the resulting structure. By contrast, referring to FIG. 5B, a dummy or permanent gate dielectric layer 510 is formed on the exposed surfaces of the semiconductor fins 502, and dummy spacers 512 are formed adjacent to the resulting structure.

Figure 4C:
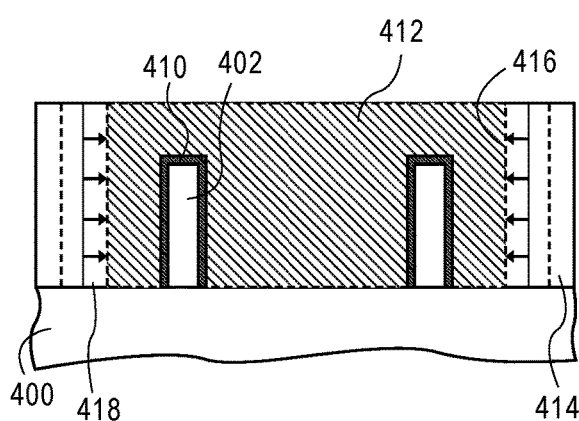

Referring to FIG. 4C, gate endcap cut patterning is performed and isolation regions 414 are formed at the resulting patterned dummy gate ends 416. In the conventional process scheme, a larger gate endcap must be fabricated to allow for gate mask mis-registration, as depicted by the arrowed regions 418. By contrast, referring to FIG. 5C, self-aligned isolation regions 514 are formed by providing an isolation layer over the structure of FIG. 5B, e.g., by deposition and planarization. In one such embodiment, the self-aligned gate endcap process does not require extra space for mask registration, as compared in FIGS. 4C and 5C.

Figure 4D:
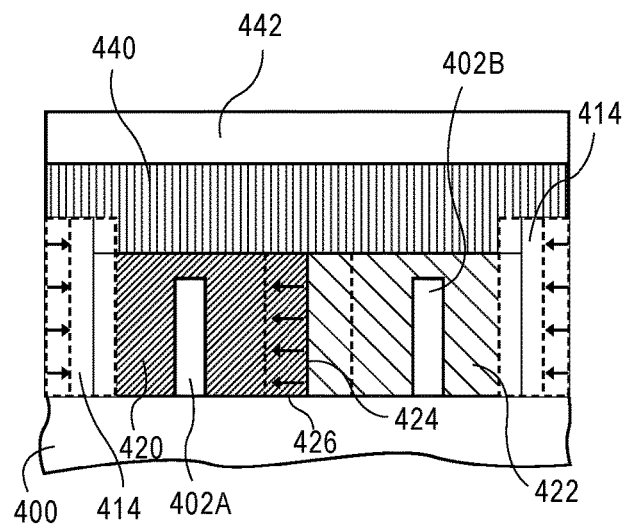

Referring to FIG. 4D, the dummy gate electrode 412 of FIG. 4C is replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 420 over a first semiconductor fin 402A and to provide a P-type gate electrode 422 over a second semiconductor fin 402B. The N-type gate electrode 420 and the P-type gate electrode 422 are formed between the isolation regions 414, but form a P/N junction 424 where they meet. The exact location of the P/N junction 424 may vary, depending on mis-registration, as depicted by the arrowed region 426.

Figure 5C:
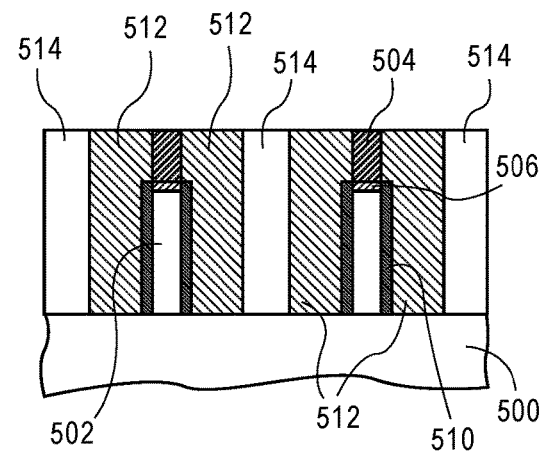
Figure 5D:
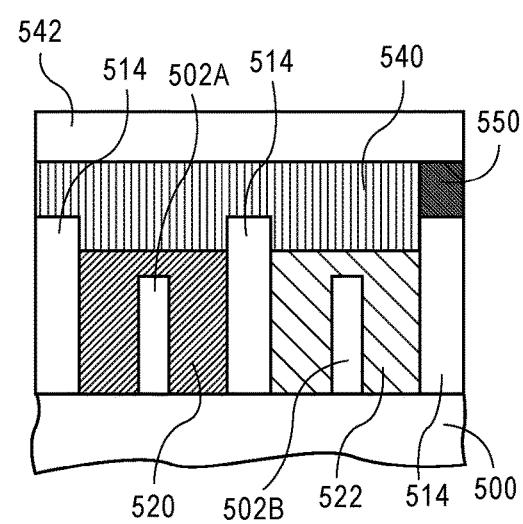

By contrast, referring to FIG. 5D, the hardmask layer 504 and pad oxide layer 506 are removed, and the dummy spacers 514 of FIG. 5C are replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 520 over a first semiconductor fin 502A and to provide a P-type gate electrode 522 over a second semiconductor fin 502B. The N-type gate electrode 520 and the P-type gate electrode 522 are formed between, and are also separated by, the gate endcap isolations structures 514.

Referring again to FIG. 4D, a local interconnect 440 may be fabricated to contact N-type gate electrode 420 and P-type gate electrode 422 to provide a conductive path around the P/N junction 424. Likewise, referring to FIG. 5D, a local interconnect 540 may be fabricated to contact N-type gate electrode 520 and P-type gate electrode 522 to provide a conductive path over the intervening isolation structure 514 there between. Referring to both FIGS. 4D and 5D, a hardmask 442 or 542 may be formed on the local interconnect 440 or 540, respectively. Referring to FIG. 5D in particular, in an embodiment, the continuity of the local interconnect 540 is interrupted by a dielectric plug 550 in cases where a break in electrical contact along a gate line are needed.

In accordance with one or more embodiments of the present disclosure, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

Embodiments of the present disclosure may be implemented to improve upon a SAGE wall formation method and location. Embodiments described herein may address difficulties in forming bi-directional SAGE walls resulting from the introduction of fin cuts. To provide context, a SAGE architecture may be implemented by fabricating a SAGE isolation structure after a process of cutting the fins to remove fin portions in select locations. By contrast, in an embodiment, processes described below involve relocation of at least some SAGE wall formation in a process scheme prior to the finalization of fin geometries. As a result, in comparison to a post fin cut-only implemented SAGE process, a process involving at least some SAGE structure formation prior to fin cut prevents wall formation orthogonal to the fin direction. In an embodiment, following pre-fin cut SAGE structure formation and associated subsequent fin cut processing, a second SAGE structure formation is performed after the fin cut process to provide a dual SAGE structure architecture.

It is to be appreciated that logic devices may be aggressively scaled in dimension, creating fabrication and yield challenges for gate and contact end cap patterning. A state-of-the-art self-aligned gate endcap (SAGE) architecture provides a potential landing spot for a gate or contact plug. The SAGE wall formation is self-aligned in the x-direction but only partly aligned in the y-direction since the SAGE architecture may be susceptible to contact to gate shorts at the fin end caps due to registration constraints at various lithographic patterning layers.

In an embodiment, fabricating SAGE walls both prior to and after a fin cut operation provides a first set of SAGE walls with locations and dimensions that arise from the natural fin pitch spacing. A second set of SAGE walls fabricated after fin cut or trim take into consideration the registration capabilities and pitch constraints for the fin end to end dimensions. The second set of SAGE walls has a different endcap spacing relative to the first set of SAGE walls, and may alleviate or altogether eliminate registration induced shorts.

Figure 6A:
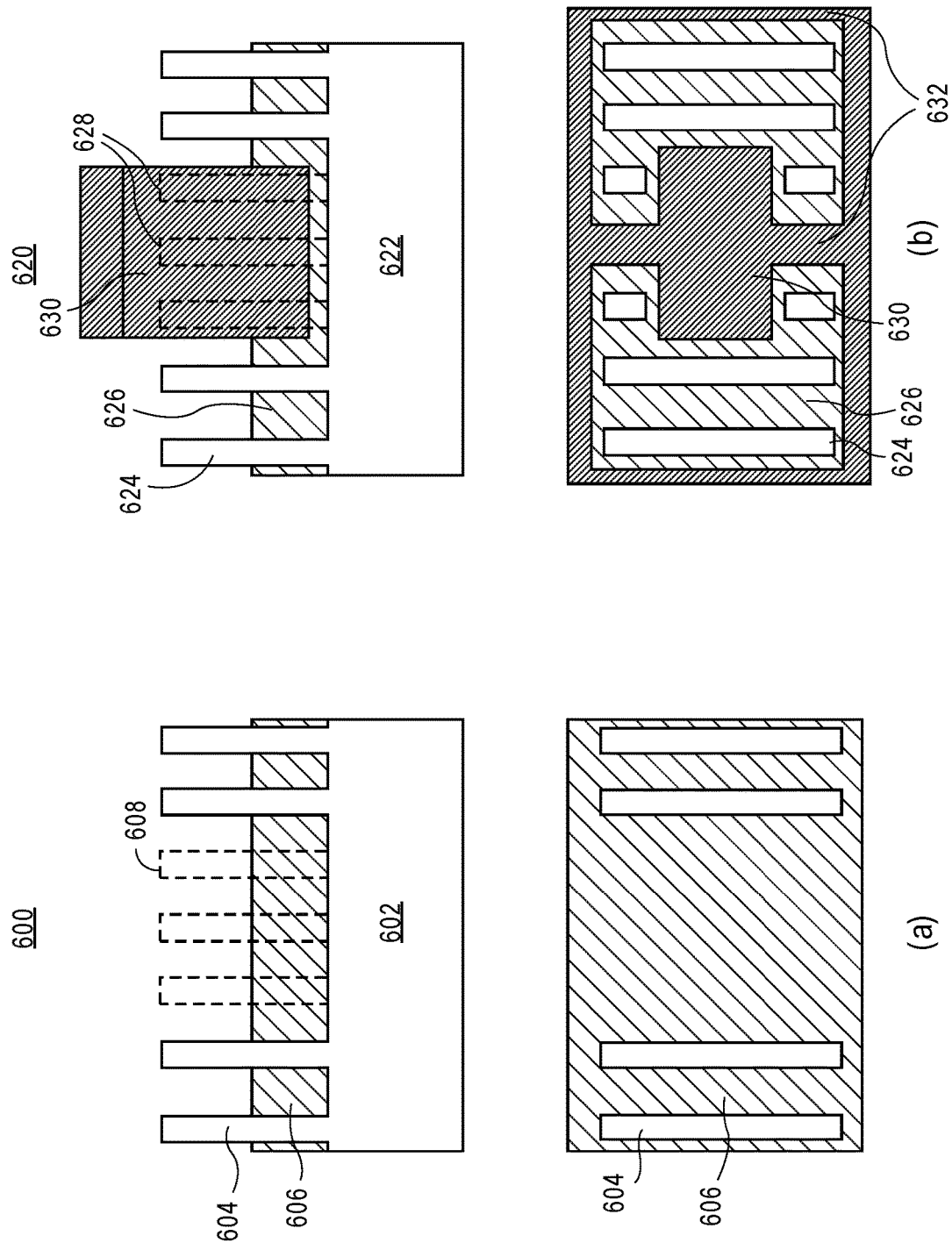
FIG. 6A illustrates cross-sectional views and corresponding plan views of integrated circuit structures fabricated (a) without a SAGE isolation structure, and (b) with a SAGE isolation structure fabricated only after a fin cut process, in accordance with an embodiment of the present disclosure.
Figure 6B:
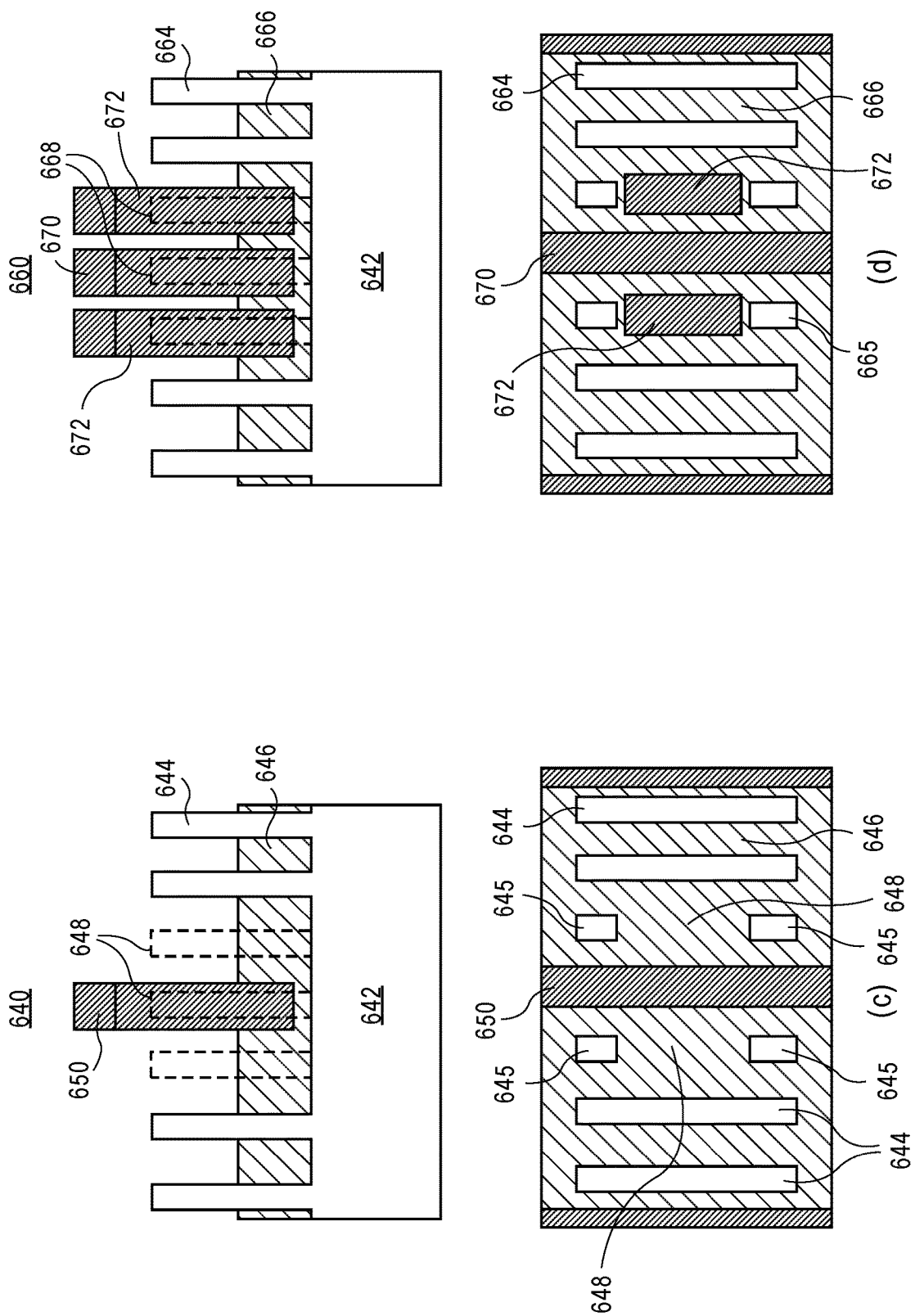
FIG. 6B illustrates cross-sectional views and corresponding plan views of integrated circuit structures fabricated (c) with a SAGE isolation structure fabricated only before a fin cut process, and (d) with SAGE isolation structures fabricated both before and after a fin cut process in accordance with an embodiment of the present disclosure.

For comparative purposes, FIG. 6A illustrates cross-sectional views and corresponding plan views of integrated circuit structures fabricated (a) without a SAGE isolation structure, and (b) with a SAGE isolation structure fabricated only after a fin cut process, in accordance with an embodiment of the present disclosure. FIG. 6B illustrates cross-sectional views and corresponding plan views of integrated circuit structures fabricated (c) with a SAGE isolation structure fabricated only before a fin cut process, and (d) with SAGE isolation structures fabricated both before and after a fin cut process in accordance with an embodiment of the present disclosure.

Referring to part (a) of FIG. 6A, an integrated circuit structure 600 fabricated without a SAGE isolation structure includes a substrate 602 having a plurality of fins 604 protruding therefrom. An isolation structure 606 laterally surrounds lower portions of the fins 604. Locations 608 indicate regions where fins or portions of fins have been removed, e.g., by a masking and etch process. A process sequence for fabricating integrated circuit structure 600 may include (i) providing a silicon substrate, (ii) hardmask formation and patterning on the silicon substrate, (iii) silicon fin patterning by etching the silicon substrate in the presence of the hardmask, (iv) fin cutting by further mask and etch processing, and (v) shallow trench isolation (STI) fill, polish and recess to form isolation structure 606.

Referring to part (b) of FIG. 6A, an integrated circuit structure 620 fabricated by forming a SAGE isolation structure only after a fin cut process, which is referred to herein as a bi-directional SAGE architecture, includes a substrate 622 having a plurality of fins 624 protruding therefrom. An isolation structure 626 laterally surrounds lower portions of the fins 624. Locations 628 indicate regions where fins or portions of fins are removed, e.g., by a masking and etch process. A SAGE wall 630 (which may include a hardmask as indicated by the horizontal line) is formed in locations 628 and has extension portions 632 extending from the SAGE wall 630. A process sequence for fabricating integrated circuit structure 620 may include (i) providing a silicon substrate, (ii) SAGE stack formation, (iii) silicon fin patterning, (iv) fin cutting by further mask and etch processing, (v) SAGE endcap/wall fabrication, and (vi) shallow trench isolation (STI) fill, polish and recess to form isolation structure 626.

Referring to part (c) of FIG. 6B, an integrated circuit structure 640 fabricated by forming a SAGE isolation structure only prior to a fin cut process, which is referred to herein as a unidirectional SAGE architecture, includes a substrate 642 having a plurality of fins 644 protruding therefrom. An isolation structure 646 laterally surrounds lower portions of the fins 644. Locations 648 indicate regions where fins or portions of fins are removed or are not formed. A SAGE wall 650 (which may include a hardmask as indicated by the horizontal line) is formed in a narrow region of location 648. In contrast, to the SAGE wall 630 of part (b) of FIG. 6A, the SAGE wall 650 has a same width adjacent a non-cut fin portion 645 as the width adjacent a fin cut portion 648. A process sequence for fabricating integrated circuit structure 640 may include (i) providing a silicon substrate, (ii) SAGE stack formation, (iii) silicon fin patterning, (iv) SAGE endcap/wall fabrication, (v) fin cutting by further mask and etch processing, and (vi) shallow trench isolation (STI) fill, polish and recess to form isolation structure 646.

Referring again to integrated structure 640, as compared to integrated circuit structure 620, by relocating the wall formation prior to fin cuts, the SAGE wall can be restricted to running along the fin direction only. Referring to the plan view (lower portion) of part (c) of FIG. 6B, in accordance with an embodiment of the present disclosure, an integrated circuit structure includes a first semiconductor fin (fin 645 to immediate left of 650) having a cut 648 along a length of the first semiconductor fin. A second semiconductor fin (fin 645 to immediate right of 650) has a cut 648 along a length of the second semiconductor fin. A gate endcap isolation structure 650 is between the first semiconductor fin and the second semiconductor fin. The gate endcap isolation structure 650 has a substantially uniform width along the lengths of the first and second semiconductor fins.

Referring to part (d) of FIG. 6B, an integrated circuit structure 660 fabricated by forming SAGE isolation structures both prior to and after a fin cut process, which is referred to herein as a dual SAGE architecture, includes a substrate 662 having a plurality of fins 664 protruding therefrom. An isolation structure 666 laterally surrounds lower portions of the fins 664. Locations 668 indicate regions where fins or portions of fins are removed or are not formed. A first SAGE wall 670 (which may include a hardmask as indicated by the horizontal line) is formed in a narrow region of location 668. The first SAGE wall 670 may be as described for SAGE wall 650 of part (c) of FIG. 6B, and may be fabricated prior to a fin cut process. In one embodiment, the first SAGE wall 670 has a same width adjacent a non-cut fin portion 665 as the width adjacent a fin cut portion 668.

Referring again to part (d) of FIG. 6B, one or more second SAGE walls 672 (which may include a hardmask as indicated by the horizontal line) is formed in locations 668 where fin cut processing has been performed following fabrication of first SAGE wall 670. A process sequence for fabricating integrated circuit structure 660 may include (i) providing a silicon substrate, (ii) SAGE stack formation, (iii) silicon fin patterning, (iv) first round of SAGE endcap/wall fabrication, (v) fin cutting by further mask and etch processing, (vi) second round of SAGE endcap/wall fabrication, and (vii) shallow trench isolation (STI) fill, polish and recess to form isolation structure 666.

With reference to part (d) of FIG. 6B, in accordance with an embodiment of the present disclosure, an integrated circuit structure 660 includes a first semiconductor fin (e.g., 665 to left of 670) having a cut 668 along a length of the first semiconductor fin 665. A second semiconductor fin (e.g., fin to right of 670) is parallel with the first semiconductor fin. A first gate endcap isolation structure 670 is between the first semiconductor fin and the second semiconductor fin. A second gate endcap isolation structure (e.g., 672 to left of 670) is in a location of the cut 648 along the length of the first semiconductor fin 665.

In one embodiment, the second endcap isolation structure 672 is parallel with and discrete from the first endcap isolation structure 670 without an intervening semiconductor fin between the first 670 and second 672 endcap isolation structures. In one embodiment, the first gate endcap isolation structure 670 has a first substantially uniform width along the lengths of the first and second semiconductor fins. The second gate endcap isolation structure 672 also has a second substantially uniform width along the lengths of the first and second semiconductor fins. In a specific embodiment, the second substantially uniform width is greater than the first substantially uniform width. In another specific embodiment, the second substantially uniform width is less than the first substantially uniform width. In yet another specific embodiment, the second substantially uniform width is the same as the first substantially uniform width.

In an exemplary processing scheme, FIGS. 7A-7F illustrate cross-sectional views representing various operations in a process for fabricating dual self-aligned gate endcap (SAGE) structures, in accordance with an embodiment of the present disclosure.

Figure 7A:
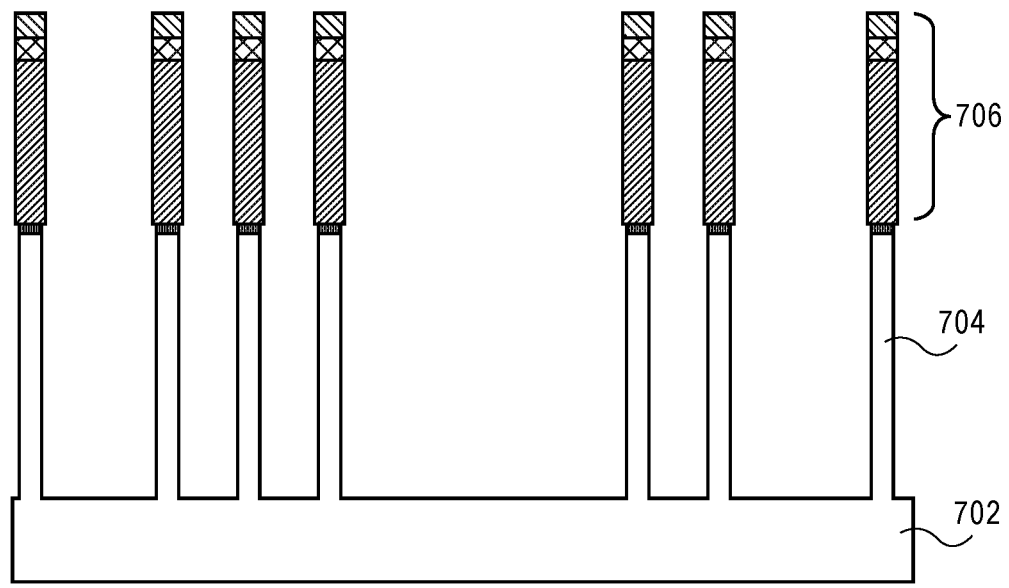
FIGS. 7A-7F illustrate cross-sectional views representing various operations in a process for fabricating dual self-aligned gate endcap (SAGE) structures, in accordance with an embodiment of the present disclosure.

Referring to FIG. 7A, a substrate 702 is patterned to have a plurality of fins 704 formed thereon. The fins 704 may have hardmask portions 706 thereon, as is depicted in FIG. 7A. In an embodiment, the hardmask portions 706 are referred to as SAGE hardmask portions since they enable formation of SAGE walls.

Figure 7B:
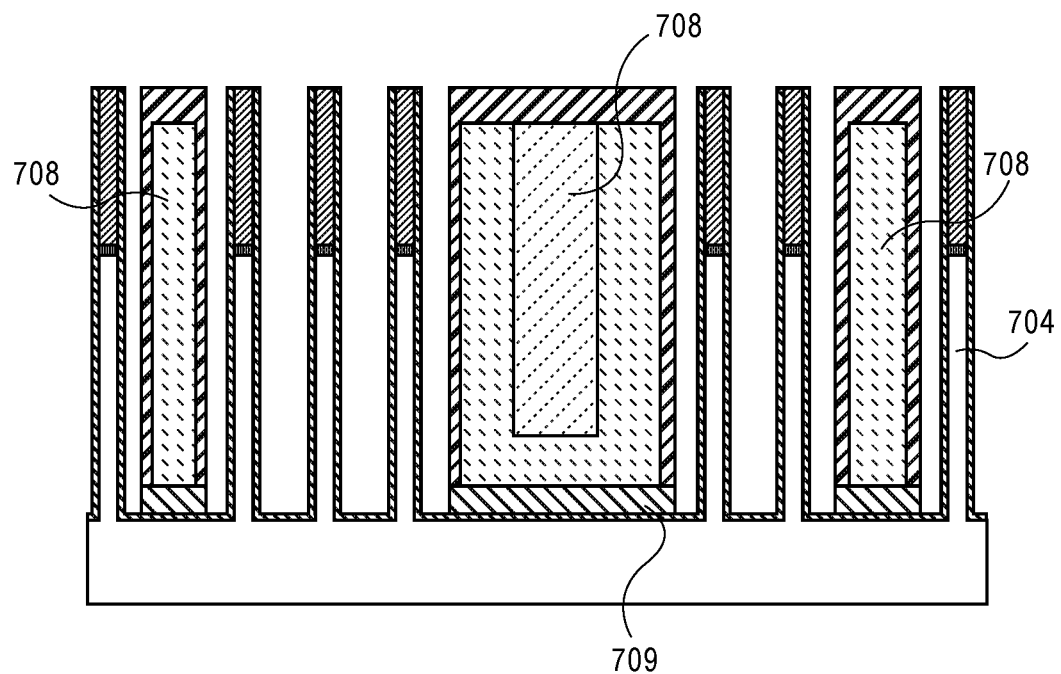

Referring to FIG. 7B, SAGE walls 708 are fabricated between fins 704. In an embodiment, SAGE walls 708 are fabricated by forming a SAGE endcap spacer onto which SAGE wall isolation material is then formed. The SAGE endcap spacer is removed, however portions 709 of the SAGE endcap spacer may remain beneath the SAGE walls 708. In an embodiment, SAGE walls 708 vary in width, as is depicted.

Figure 7C:
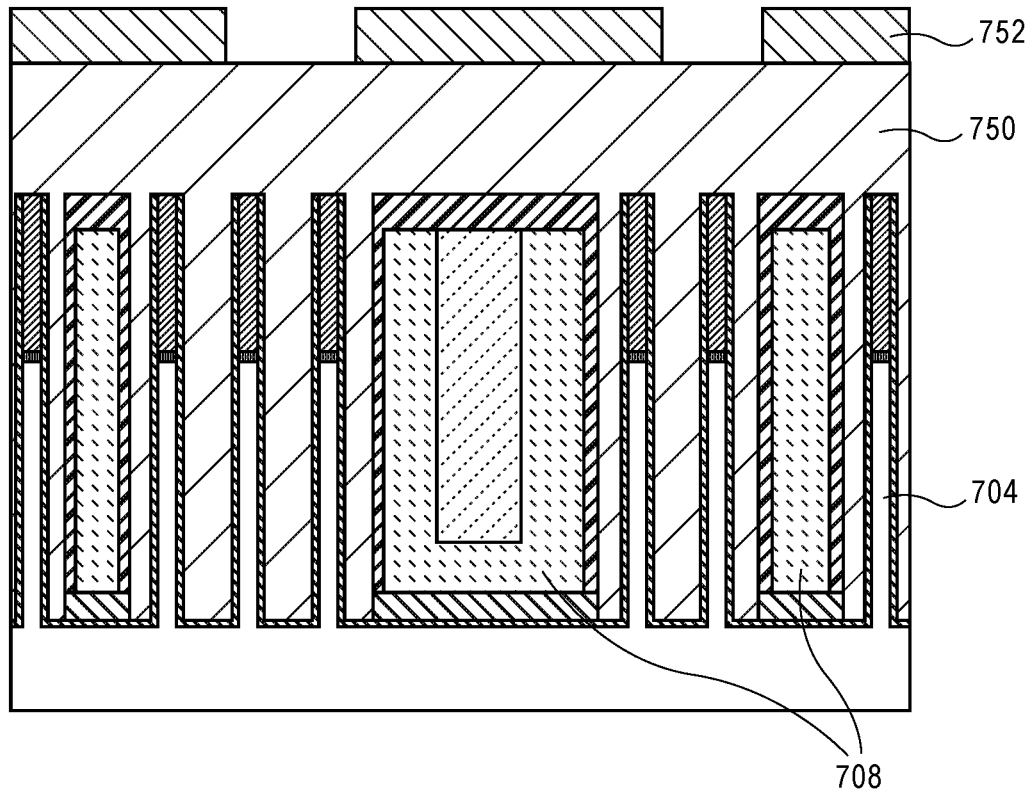

Referring to FIG. 7C, a fin trim lithography process may then be performed on the structure of FIG. 7B. In an embodiment, a hardmask layer 750 has a photoresist or lithographic material stack 752 patterned thereon.

Figure 7D:
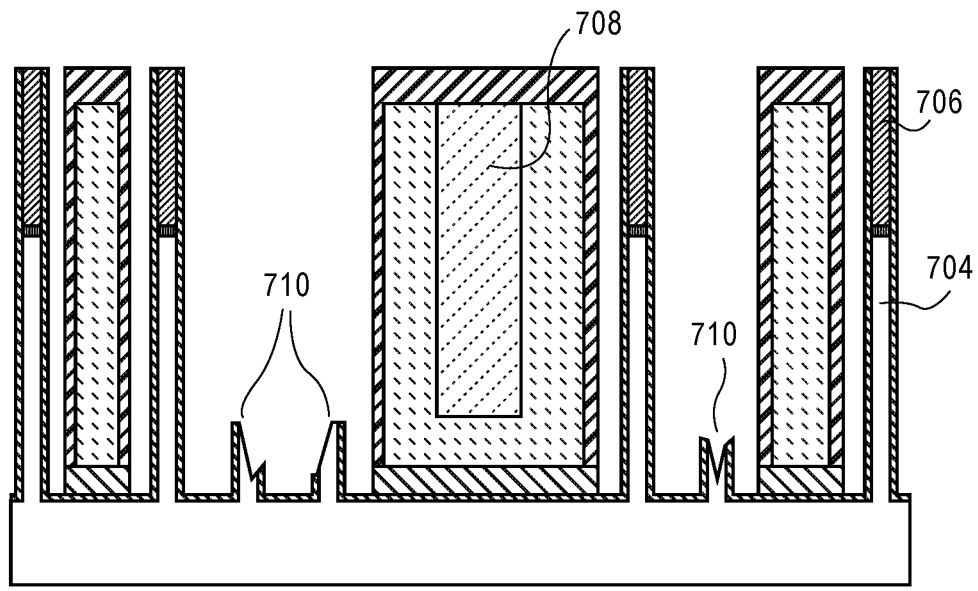

Referring to FIG. 7D, a fin trim etch process may then be performed on the structure of FIG. 7C. In an embodiment, portions of the hardmask layer 750 and underlying fins 704 exposed by the openings of photoresist or lithographic material stack 752 are etched to provide cut fins portions 710. The remaining portions of hardmask layer 750 and photoresist or lithographic material stack 752 are then removed, as is depicted. As such, fin cuts are fabricated subsequent to SAGE wall 708 formation. In one embodiment, such a process flow enables fabrication of a SAGE wall 708 that is of uniform width (also referred to herein as unidirectional) along fins even at locations having fin cuts.

Figure 7E:
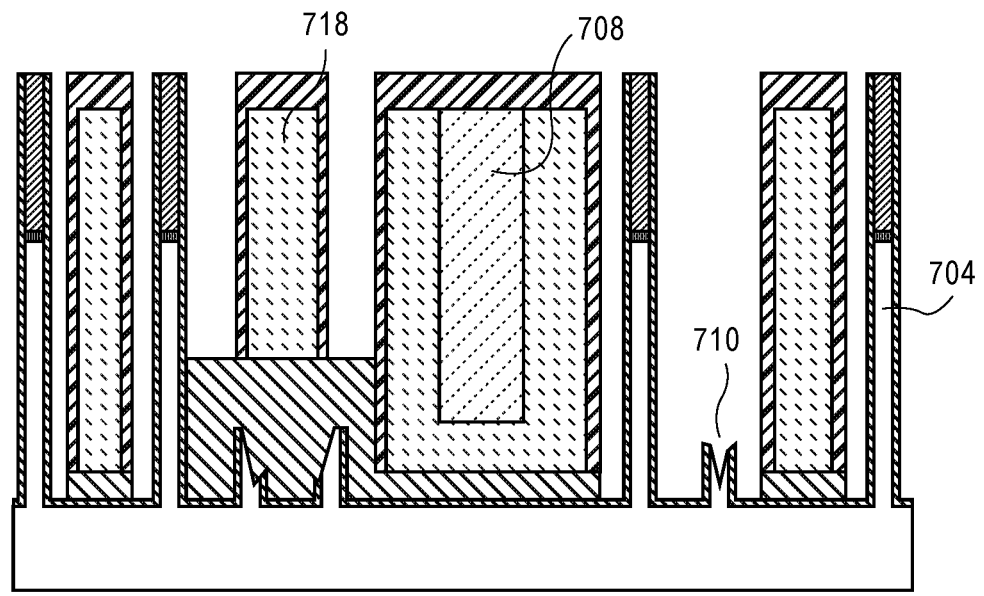

Referring to FIG. 7E, a SAGE wall 718 is fabricated over a location of cut fins portions 710. In an embodiment, one or more SAGE walls 718 is fabricated by forming a second SAGE endcap spacer onto which SAGE wall isolation material is then formed. The second SAGE endcap spacer is removed, however portions 719 of the second SAGE endcap spacer may remain beneath the SAGE walls 718. In an embodiment, SAGE walls 718 are formed in locations having two or more adjacent fin cut portions 710 but are not formed in locations having only one fin cut portion 710, as is depicted.

Figure 7F:
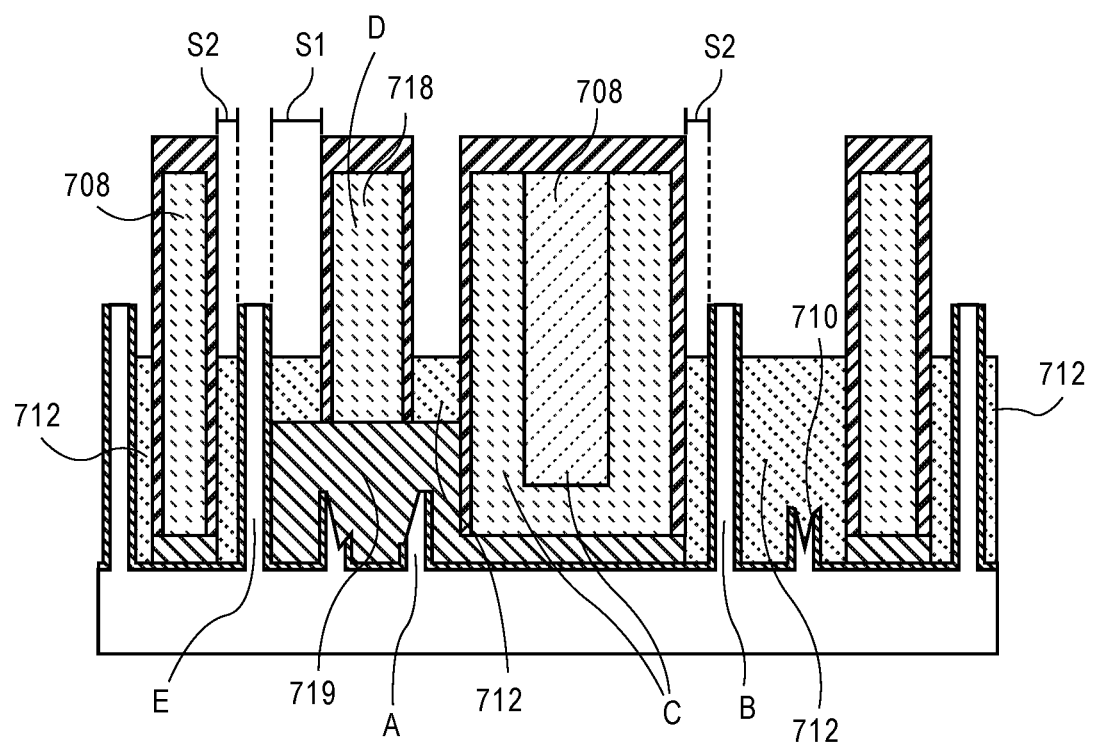

Referring to FIG. 7F, isolation structures 712 (also referred to as shallow trench isolation, or STI) are formed at lower fin regions. In an embodiment, isolation structures 712 are formed by depositing isolation material over the structure of FIG. 7E, and then planarizing and recessing the isolation material.

It is to be appreciated that subsequent processing may involve the fabrication of gate lines formed over the structure of FIG. 7F. Such gate lines may be dummy gate lines. The dummy gate lines are later replaced with permanent gate structures, e.g., using a replacement gate process. In an embodiment, the permanent gate lines are ultimately formed to have upper surfaces below the SAGE walls 708 and 718, and may be interconnected by local interconnects formed over the SAGE walls 708 and 718, as described above.

In an embodiment, with reference again to FIG. 7F, an integrated circuit structure includes a first semiconductor fin 704 (A) having a cut 710 along a length of the first semiconductor fin 704 (A). A second semiconductor fin 704 (B) is parallel with the first semiconductor fin 704 (A). A first gate endcap isolation structure 708 (C) is between the first semiconductor fin 704 (A) and the second semiconductor fin 704 (B). A second gate endcap isolation structure 718 (D) is in a location of the cut 710 along the length of the first semiconductor fin 704 (A). The second endcap isolation structure 718 (D) is parallel with and discrete from the first endcap isolation structure 708 (C) without an intervening semiconductor fin between the first 708 (C) and second 718 (D) endcap isolation structures.

In one embodiment, the second gate endcap isolation structure 718 (D) has a bottom surface above a bottom surface of the first gate endcap isolation structure 708 (C), as is depicted. In one embodiment, a third semiconductor fin 704 (E) is parallel with the first 704 (A) and second 704 (B) semiconductor fins. The third semiconductor fin 704 (E) is spaced apart from the second gate endcap isolation structure 718 (D) by a first spacing (S1) at a side of the second gate endcap isolation structure 718 (D) opposite the first gate endcap isolation structure 708 (C). The second semiconductor fin 704 (B) is spaced apart from the first gate endcap isolation structure 708 (C) by a second spacing (S2) less than the first spacing (S1), as is depicted.

In one embodiment, the first gate endcap isolation structure 708 (C) has a first substantially uniform width along the lengths of the first and second semiconductor fins (i.e., into and out of the page). In one such embodiment, the second gate endcap isolation structure 718 (D) has a second substantially uniform width along the lengths of the first and second semiconductor fins (i.e., into and out of the page). In one such embodiment, the second substantially uniform width is less than the first substantially uniform width, as is depicted. In another such embodiment, the second substantially uniform width is greater than the first substantially uniform width. In yet another such embodiment, the second substantially uniform width is the same as the first substantially uniform width.

In another aspect, system-on-chip (SoC) process technologies typically require support of standard logic (e.g., low voltage, thin-oxide) and I/O (e.g., high voltage, thick-oxide) transistors. The distinction between standard logic and high voltage (HVI/O) devices may be accomplished through a multi-oxide process sequence, where logic transistors receive a thin, high-performance oxide and I/O devices receive a thick oxide capable to sustain higher voltages. As process technologies scale, the logic devices aggressively scale in dimension, creating fabrication challenges with dual-oxide formation. In accordance with one or more embodiments of the present disclosure, a high voltage endcap process is combined with a dual ultra-scaled finfet transistor architecture to provide a multi-self-aligned endcap process.

To provide context, as technology nodes scale smaller, there is an increasing lack of geometrical space in a narrow-endcap logic device to accommodate a defect-free dual oxide process that may be needed for high-voltage transistor fabrication. Current approaches rely upon a single, unscaled endcap space to accommodate a single logic oxide process. However, such a process may be incompatible with highly scaled geometries supporting a dual-oxide high-voltage SoC technology, since the endcap space may be insufficient to accommodate both oxides (gate dielectrics).

In accordance with an embodiment of the present disclosure, scaling limitation imposed by requirements fill high-voltage gates with both the high-voltage oxide and logic oxide are addressed. In particular, as logic dimensions decrease, the endcap space in high voltage (HV) devices becomes insufficiently narrow to fill both oxides. In an embodiment, different endcap spaces between logic transistor and high-voltage transistor, respectively, are fabricated in a SAGE architecture prior to a fin cut process. The logic transistor endcap is ultra-scaled by using the self-aligned endcap architecture, while the high-voltage transistor has a wider endcap to accommodate a thicker gate dielectric. Both endcaps are unidirectional endcaps in that they are formed prior to fin cut processing. In an embodiment, additional endcaps are formed after fin cut processing to form a multiple SAGE architecture.

One or more embodiments described herein are directed to, or may be referred to as, a multi-unidirectional endcap process flow for ultra-scaled logic endcap. To provide context, in a typical SAGE flow, a single endcap spacer is deposited to form a self-aligned endcap separating a fin from a SAGE wall. Embodiments described herein may involve formation of differential sacrificial spacer thickness between logic and HV gates. Subsequently, a self-aligned endcap wall is formed. The differential spacer widths are chosen to be thicker in the high voltage areas, and the standard thickness is used in the logic areas. The differential spacer widths may enable high-voltage oxide to be successfully deposited, without sacrificing density in the logic areas. In an embodiment, the thickness of the differential spacer is dependent on the intended HV oxide thickness. In an embodiment, a fin cut process is performed after forming the above endcap structures, and additional endcap structures are then fabricated following the fin cut process.

Figure 8A:
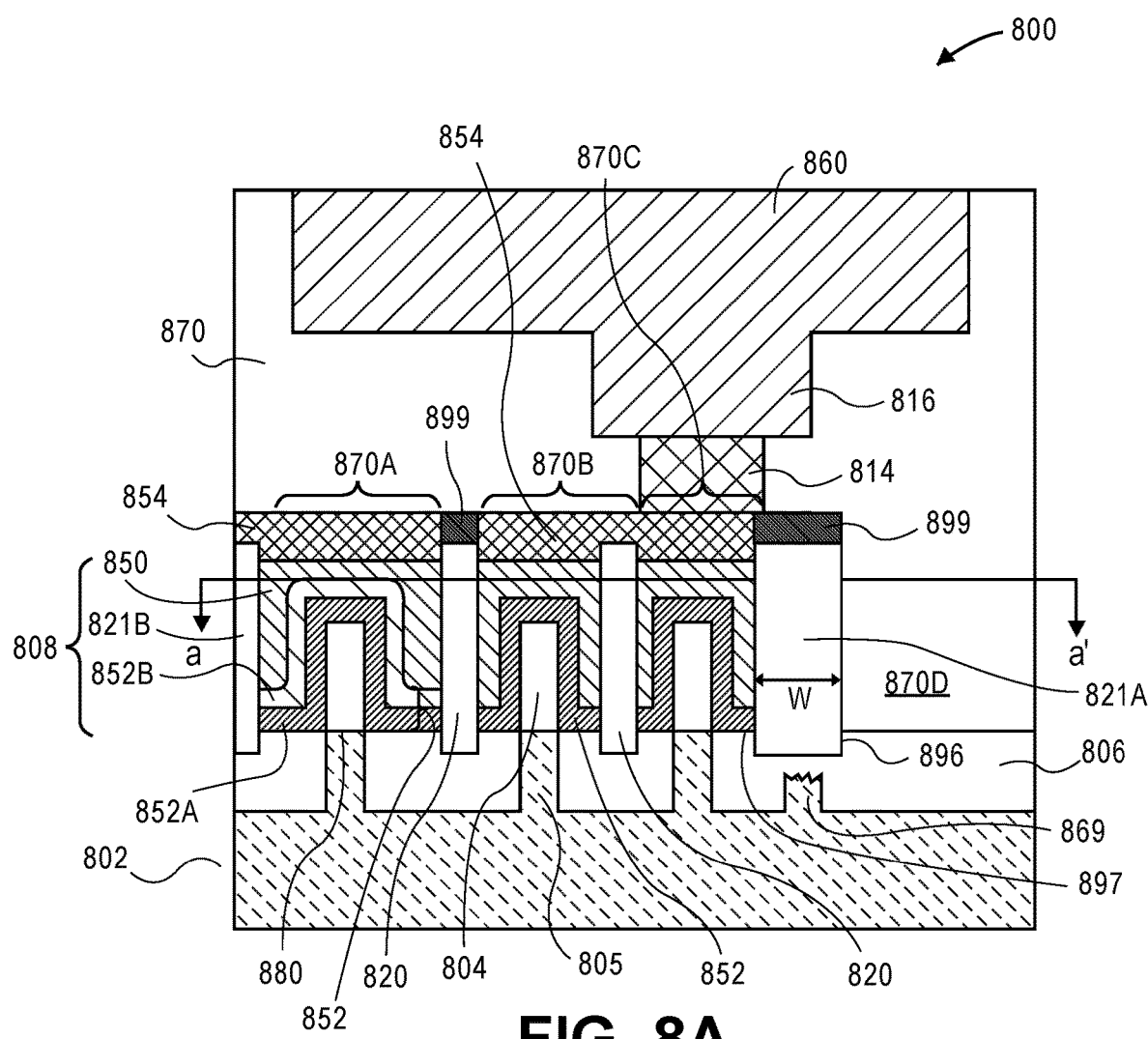
FIG. 8A illustrates a cross-sectional view of non-planar semiconductor devices having a multi-self-aligned gate endcap isolation structure architecture, in accordance with an embodiment of the present disclosure.
Figure 8B:
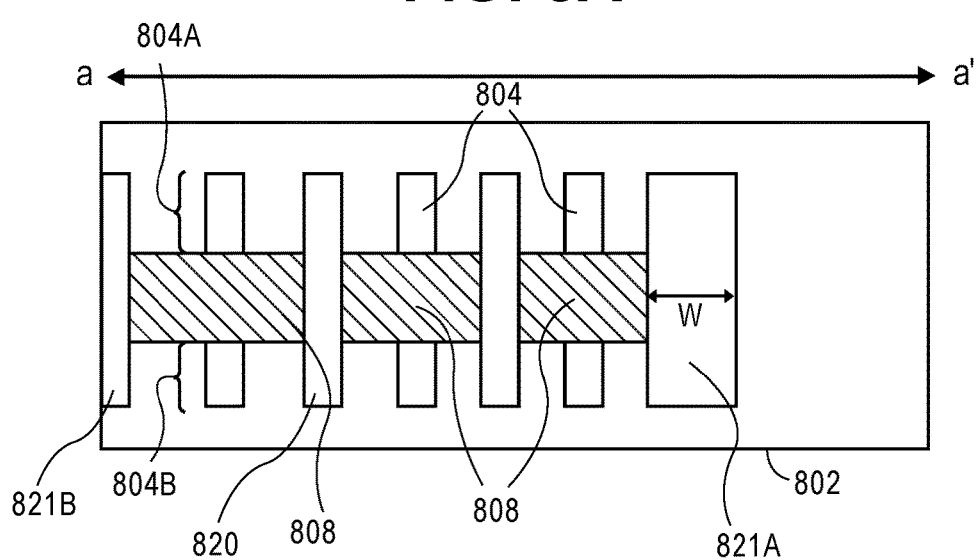
FIG. 8B illustrates a plan view taken along the a-a' axis of the semiconductor devices of FIG. 8A, in accordance with an embodiment of the present disclosure.

As an example of completed devices, FIG. 8A illustrates a cross-sectional view of non-planar semiconductor devices having a multi-self-aligned gate endcap isolation structure architecture, in accordance with an embodiment of the present disclosure. FIG. 8B illustrates a plan view taken along the a-a' axis of the structure of FIG. 8A, in accordance with an embodiment of the present disclosure.

Referring to FIG. 8A, a semiconductor structure 800 includes non-planar active regions (e.g., fin structures each including a protruding fin portion 804 and a sub-fin region 805) formed from substrate 802, and within a trench isolation layer 806. In an embodiment, the fin structures are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach. Each of the individual fins 804 depicted may represent corresponding individual fins, or may represent a plurality of fins at a given location.

Gate structures 808 are over the protruding portions 804 of the non-planar active regions as well as over a portion of the trench isolation layer 806. As shown, gate structures 808 include a gate electrode 850 and a gate dielectric layer 852. In one embodiment, although not shown, gate structures 808 may also include a dielectric cap layer.

Gate structures 808 are separated by narrow self-aligned gate endcap (SAGE) isolation structures or walls 820, 821A or 821B. The SAGE walls 820 each have a width. In an embodiment, the SAGE wall 821A has a width greater than the width of each of the SAGE walls 820, and the SAGE wall 821B has a width less than the width of each of the SAGE walls 820. SAGE walls of differing width may be associated with different device types, as described in an exemplary embodiment below. It is to be appreciated that the varying of widths for SAGE wall can be rearranged. Also, in other embodiments, the widths are all the same. Each SAGE wall 820, 821A or 821B may include one or more of a local interconnect 854 or a dielectric plug 899 formed thereon. In an embodiment, each of the SAGE walls 820, 821A or 821B is recessed below an uppermost surface 897 of the trench isolation layer 806, as is depicted in FIG. 8A.

In accordance with an embodiment of the present disclosure, SAGE wall 821A is formed in a location of a cut fin. In a particular embodiment, SAGE wall 821A is formed over a cut portion 869 of a fin, as is depicted. In an embodiment, SAGE walls 820 and 821B are fabricated prior to a fin cut process, and SAGE wall 821A is fabricated after the fin cut process.

In an exemplary embodiment, the semiconductor structure 800 includes a first plurality of semiconductor fins (fin or fins 804 of region 870A) above a substrate 802 and protruding through an uppermost surface 897 of a trench isolation layer 806, and a first gate structure (gate structure 808 of region 870A) over the first plurality of semiconductor fins. A second plurality of semiconductor fins (fin or fins 804 of region 870B) is above the substrate 802 and protrudes through the uppermost surface 897 of the trench isolation layer 806, and a second gate structure (gate structure 808 of region 870B) is over the second plurality of semiconductor fins. A gate endcap isolation structure (left-hand SAGE wall 820) is between and in contact with the first gate structure and the second gate structure. A semiconductor fin of the first plurality of semiconductor fins closest to the gate endcap isolation structure (from region 870A) is spaced farther from the gate endcap isolation structure than a semiconductor fin of the second plurality of semiconductor fins closest to the gate endcap isolation structure (from region 870B).

In an embodiment, region 870A is an I/O region, and region 870B is a logic region. As depicted, in one such embodiment, a second logic region 870C is adjacent the logic region 870B, and is electrically connected to the logic region 870B by a local interconnect 854. Another region 870D may be a location where an addition logic or I/O region may be placed. Embodiments described herein may involve differential spacing from a SAGE wall (e.g., a wider spacing from SAGE walls 821B and left-hand 820 in region 870A), or may involve SAGE walls of differing width (e.g., narrower 821B versus 820 versus wider 821A), or both differential spacing from a SAGE wall and SAGE walls of differing width. In an embodiment, I/O regions have a greater spacing between SAGE walls than a logic region. In an embodiment, a wider SAGE wall is between adjacent logic regions than is between adjacent I/O regions.

A gate contact 814, and overlying gate contact via 816 are also seen from this perspective, along with an overlying metal interconnect 860, all of which are in interlayer dielectric stacks or layers 870. Also seen from the perspective of FIG. 8A, the gate contact 814 is, in one embodiment, over the non-planar active regions. As is also depicted in FIG. 8A, an interface 880 exists between a doping profile of protruding fin portions 804 and sub-fin regions 805, although other embodiments do not include such an interface in doping profile between these regions.

Referring to FIG. 8B, the gate structures 808 are shown as over the protruding fin portions 804, as isolated by self-aligned gate endcap isolation structures 820. In an embodiment, the gate structures 808 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 8B, source and drain regions 804A and 804B of the protruding fin portions 804 are shown in this perspective, although it is to be appreciated that these regions would be overlapped with trench contact structures. In one embodiment, the source and drain regions 804A and 804B are doped portions of original material of the protruding fin portions 804. In another embodiment, the material of the protruding fin portions 804 is removed and replaced with another semiconductor material, e.g., by epitaxial deposition. In either case, the source and drain regions 804A and 804B may extend below the height of trench isolation layer 806, i.e., into the sub-fin region 805.

In an embodiment, the semiconductor structure 800 includes non-planar devices such as, but not limited to, a finFET or a tri-gate device. In such an embodiment, a corresponding semiconducting channel region is composed of or is formed in a three-dimensional body. In one such embodiment, the gate structures 808 surround at least a top surface and a pair of sidewalls of the three-dimensional body.

Substrate 802 may be composed of a semiconductor material that can withstand a manufacturing process and in which charge can migrate. In an embodiment, substrate 802 is a bulk substrate composed of a crystalline silicon, silicon/germanium or germanium layer doped with a charge carrier, such as but not limited to phosphorus, arsenic, boron or a combination thereof, to form active region 804. In one embodiment, the concentration of silicon atoms in bulk substrate 802 is greater than 97%. In another embodiment, bulk substrate 802 is composed of an epitaxial layer grown atop a distinct crystalline substrate, e.g. a silicon epitaxial layer grown atop a boron-doped bulk silicon mono-crystalline substrate. Bulk substrate 802 may alternatively be composed of a group III-V material. In an embodiment, bulk substrate 802 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 802 is composed of a III-V material and the charge-carrier dopant impurity atoms are ones such as, but not limited to, carbon, silicon, germanium, oxygen, sulfur, selenium or tellurium.

Trench isolation layer 806 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the trench isolation layer 806 is composed of a dielectric material such as, but not limited to, silicon dioxide, silicon oxy-nitride, silicon nitride, or carbon-doped silicon nitride.

Self-aligned gate endcap isolation structures 820, 821A and 821B may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide. Additional examples are described below in association with FIGS. 9A-9C.

Gate structures 808 may be composed of a gate electrode stack which includes a gate dielectric layer 852 and a gate electrode layer 850. In an embodiment, the gate electrode of the gate electrode stack is composed of a metal gate and the gate dielectric layer includes a high-K material.

In an exemplary embodiment, the gate structure 808 of region 870A includes a first gate dielectric 852 conformal with the first plurality of semiconductor fins and laterally adjacent to and in contact with a first side of the gate endcap isolation structure (left-hand 820). The second gate stack of region 870B includes a second gate dielectric 852 conformal with the second plurality of semiconductor fins and laterally adjacent to and in contact with a second side of the gate endcap isolation structure opposite the first side of the gate endcap isolation structure. In one embodiment, the first gate dielectric is thicker than the second gate dielectric, as is depicted in FIG. 8A. In one embodiment, the first gate dielectric has more dielectric layers (e.g., layers 852A and 852B) than the second gate dielectric (e.g., only layer 852). In an embodiment, the gate dielectric of region 870A is an I/O gate dielectric, and the gate dielectric of region 870B is a logic gate dielectric.

In an embodiment, the gate dielectric of region 870B is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 802. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate. In an embodiment, the gate dielectric of region 870A includes a layer of non-native silicon oxide in addition to a layer of high-k material. The layer of non-native silicon oxide may be formed using a CVD process and may be formed below or above the layer of high-k material. In an exemplary embodiment, the layer of non-native silicon oxide (e.g., layer 852A) is formed below a layer of high-k material (e.g., layer 852B).

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 854, gate contact 814, overlying gate contact via 816, and overlying metal interconnect 860 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 800 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 808 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 800. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 8A, in an embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that, as exemplified in FIGS. 8A and 8B, SAGE walls of varying width may be fabricated. It is also to be appreciated that fabrication of gate endcap isolation structures may lead to formation of a seam within the gate endcap isolation structures. It is also to be appreciated that a stack of dielectric layers may be used to form a SAGE wall. It is also to be appreciated that gate endcap isolation structures may differ in composition depending on the spacing of adjacent fins. As an example covering all such aspects, FIGS. 9A-9C illustrate cross-sectional views of process operations of significance in another self-aligned gate endcap process fabrication scheme for finFET or tri-gate devices, in accordance with an embodiment of the present disclosure.

Figure 9A:
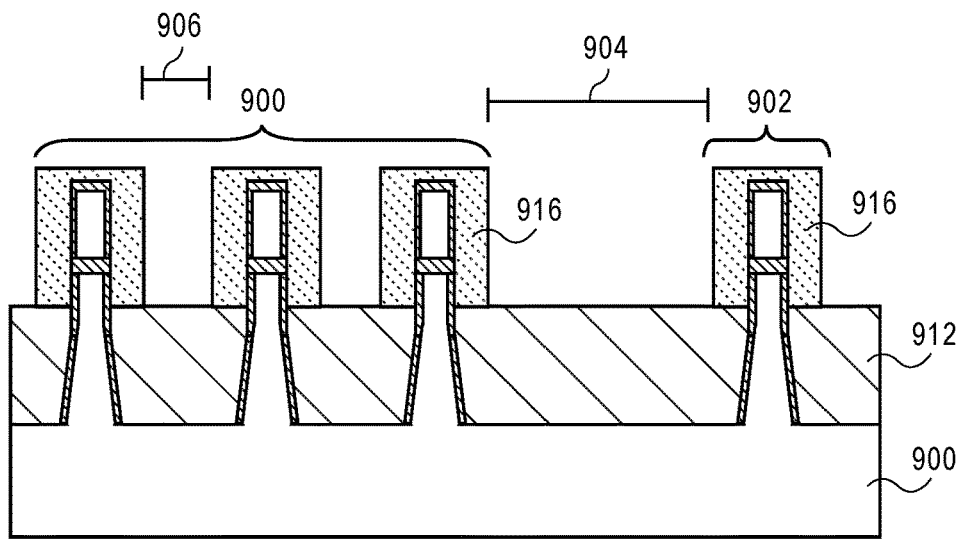
FIGS. 9A-9C illustrate cross-sectional views of process operations of significance in another self-aligned gate endcap process fabrication scheme for finFET or tri-gate devices, in accordance with an embodiment of the present disclosure.

Referring to FIG. 9A, a grouping of fins 900 has a spacing 906. The grouping of fins 900 is adjacent to a fin 902 by a larger spacing 904. Sacrificial spacers 916 are formed adjacent to sidewalls of the upper portions of each of plurality of semiconductor fins 900 and 902.

Figure 9B:
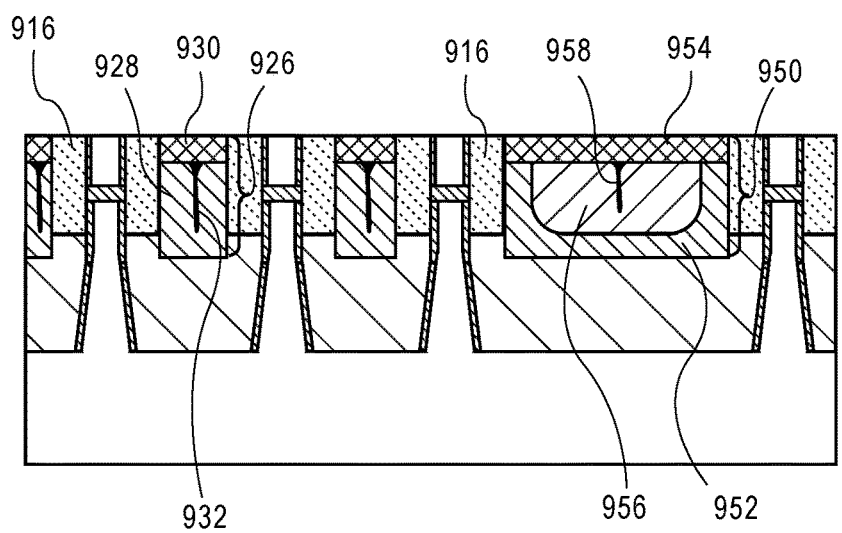
Figure 9C:
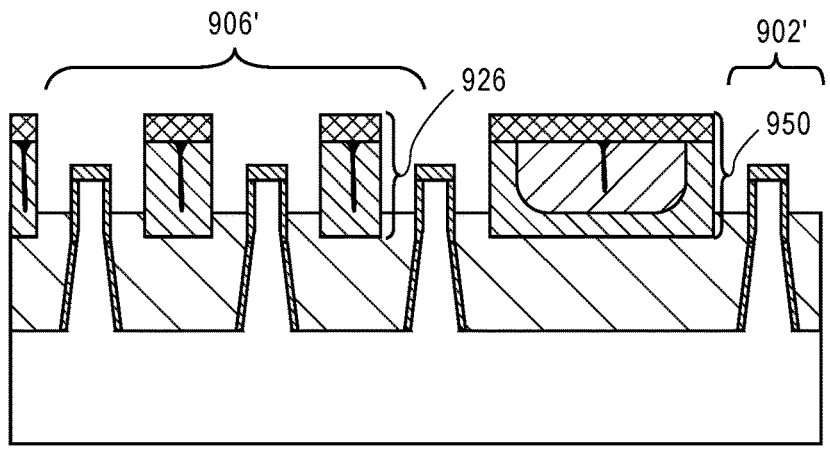

Referring to FIG. 9B, a plurality of gate endcap isolation structures 926 and 950 is formed between the sacrificial spacers 916. For the sake of the present discussion, at least some of the SAGE walls depicted are fabricated prior to a fin cut process, or at least some of the SAGE walls depicted are fabricated after a fin cut process, or some of the SAGE walls are fabricated before a fin cut process while other SAGE walls are fabricated after the fin cut process. In an embodiment, as depicted, each of the plurality of gate endcap isolation structures 926 formed between spacings 906 includes a lower dielectric portion 928 and a dielectric cap 930 on the lower dielectric portion 928. In an embodiment, the plurality of gate endcap isolation structures 926 is formed by depositing and then recessing a first dielectric material, such as a silicon nitride layer, to provide the lower dielectric portions 928. The deposition process may be a conformal process which, in one embodiment, provides seams 932 within the lower dielectric portion 928. Thus, in an embodiment, each of the plurality of gate endcap isolation structures 926 includes a vertical seam 932 centered within the gate endcap isolation structure 926. A dielectric cap material, such as a metal oxide material (e.g., hafnium oxide) is then formed in recessed regions above the lower dielectric portions 928. The dielectric cap material may be planarized to form the dielectric cap 930 or may be grown upward to provide the dielectric cap 930 directly.

Referring again to FIG. 9B, in an embodiment, a gate endcap isolation structure 926 is between semiconductor fins having a spacing 906 and a gate endcap isolation structure 950 is between semiconductor fins having a spacing 904. The gate endcap isolation structure 926 has a width narrower than a corresponding width of gate endcap isolation structure 950. In one embodiment, the gate endcap isolation structure 926 has a total composition different than a total composition of the gate endcap isolation structure 950. In one such embodiment, gate endcap isolation structure 950 further includes a third dielectric layer 956, such as a layer of silicon oxide on a bottom portion of and within sidewalls of a lower dielectric portion 952. A dielectric cap 952 is further on the third dielectric layer 956. In an embodiment, the sidewalls of the lower dielectric portion 952 have an uppermost surface approximately co-planar with an uppermost surface of the third dielectric layer 956, and the dielectric cap 952 has a substantially planar bottommost surface, as is depicted in FIG. 9B. In another embodiment, the sidewalls of the lower dielectric portion 952 have an uppermost surface below an uppermost surface of the third dielectric layer 956, and the dielectric cap 952 extends further down over the sidewall locations. In yet another embodiment, the sidewalls of the lower dielectric portion 952 have an uppermost surface above an uppermost surface of the third dielectric layer 956, and the dielectric cap 952 extends further down over the third dielectric layer 956.

In an embodiment, the deposition process of layer 956 is a conformal process which, in one embodiment, provides vertical seams 958 within the third dielectric layer 956. However, in another embodiment, a seam 958 is not formed in wider structures but is formed in narrower structures (e.g., seam 932 described above). It is to be appreciated that layers 928 and 952 may be composed of a same material, such as silicon nitride, and formed at a same time as one another. It is also to be appreciated that layers 930 and 954 may be composed of a same material, such as hafnium oxide, and formed at a same time as one another. The third dielectric layer 956 in structure 950 but omitted from structure 926 may be formed by conformal deposition across the entire structure but is excluded from structures 926 since the layer 928 essentially fills the spacing 906 in a first deposition process which does not entirely fill the spacing 904.

Referring to FIG. 9C, the sacrificial spacers 916 are removed. In an embodiment, the sacrificial spacers 916 are removed by a wet etch or dry etch process. In an embodiment, patterning stack layers above the fins are also removed to provide fins 906' and 902'.

Referring again to FIG. 9C, in an embodiment, a gate endcap isolation structure 926 or 950 is in corresponding recesses below an uppermost surface of a trench isolation layer. In an embodiment, a gate endcap isolation structure 926 or 950 includes a lower dielectric portion and a dielectric cap on the lower dielectric portion. In an embodiment, a gate endcap isolation structure 926 or 950 includes a vertical seam centered within the second gate endcap isolation structure. In an embodiment, a first gate endcap isolation structure 926 has a total composition different than a total composition of the second gate endcap isolation structure 950, e.g., by the inclusion of an additional fill dielectric material.

In an embodiment where a gate endcap isolation structure 926 or 950 includes a lower dielectric portion and a dielectric cap on the lower dielectric portion, the gate endcap isolation structure 926 or 950 may be formed by first depositing and then recessing a first dielectric material, such as a SiN layer, a SiCN layer, a SiOCN layer, a SiOC layer, or a SiC layer, to provide the lower dielectric portion. In one embodiment, the first dielectric material is a silicon nitride layer. A dielectric cap material, such as a metal oxide material (e.g., hafnium oxide, hafnium aluminum oxide, or aluminum oxide) is then formed in recessed regions above the lower dielectric portion. In one embodiment, the metal oxide material is hafnium oxide. In another embodiment, the dielectric cap material is a low-k dielectric material. The dielectric cap material may be planarized to form the dielectric cap or may be grown upward to provide the dielectric cap directly. It is to be appreciated that, in accordance with one or more embodiments of the present disclosure, the gate endcap isolation structures each have a constant width into and out of the page even in locations where fin cuts exist.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
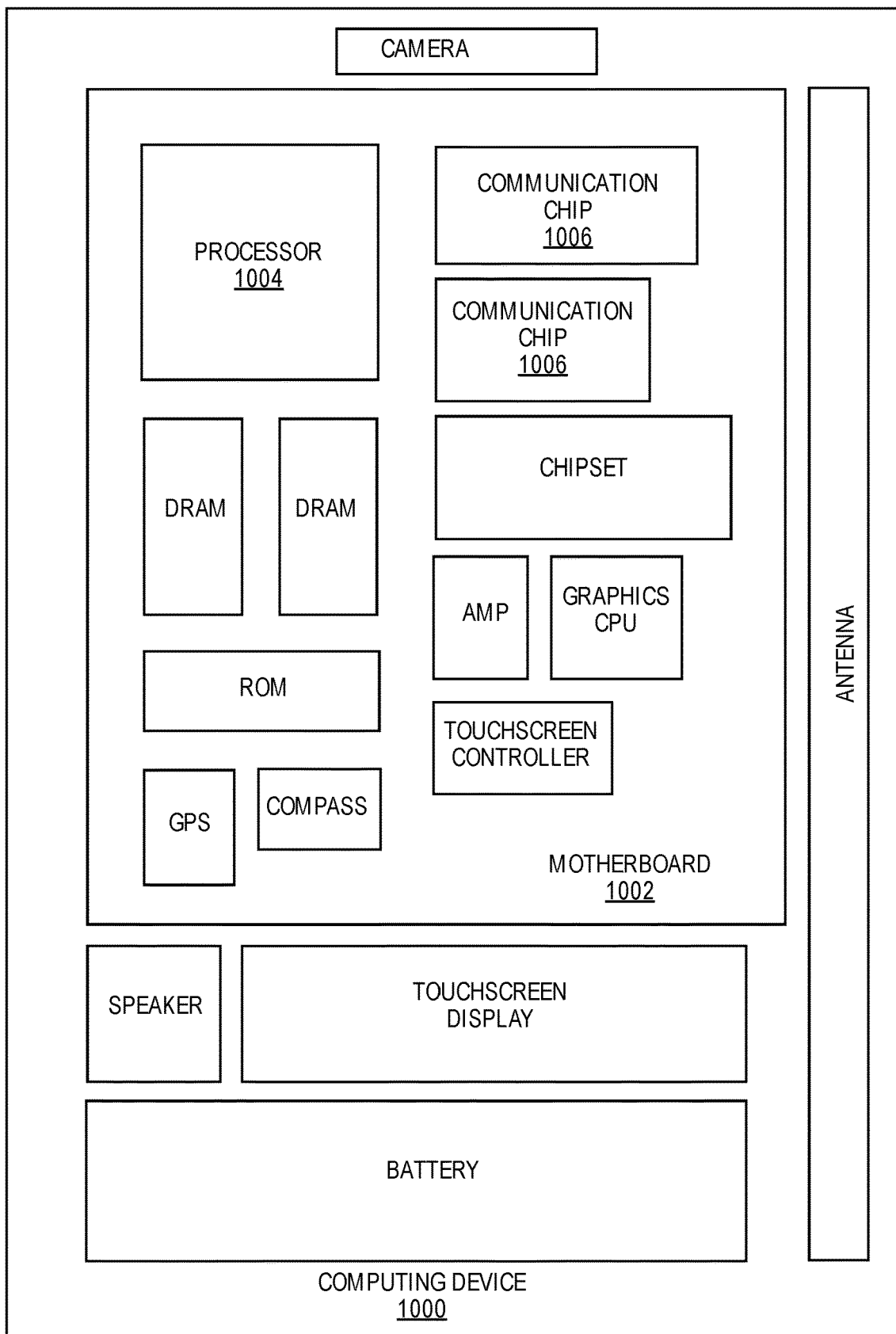
FIG. 10 illustrates a computing device in accordance with one implementation of an embodiment of the disclosure.

FIG. 10 illustrates a computing device 1000 in accordance with one implementation of an embodiment of the present disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as self-aligned gate endcap (SAGE) structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as self-aligned gate endcap (SAGE) structures built in accordance with implementations of embodiments of the present disclosure.

In further implementations, another component housed within the computing device 1000 may contain an integrated circuit die that includes one or structures, such as self-aligned gate endcap (SAGE) structures built in accordance with implementations of embodiments of the present disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
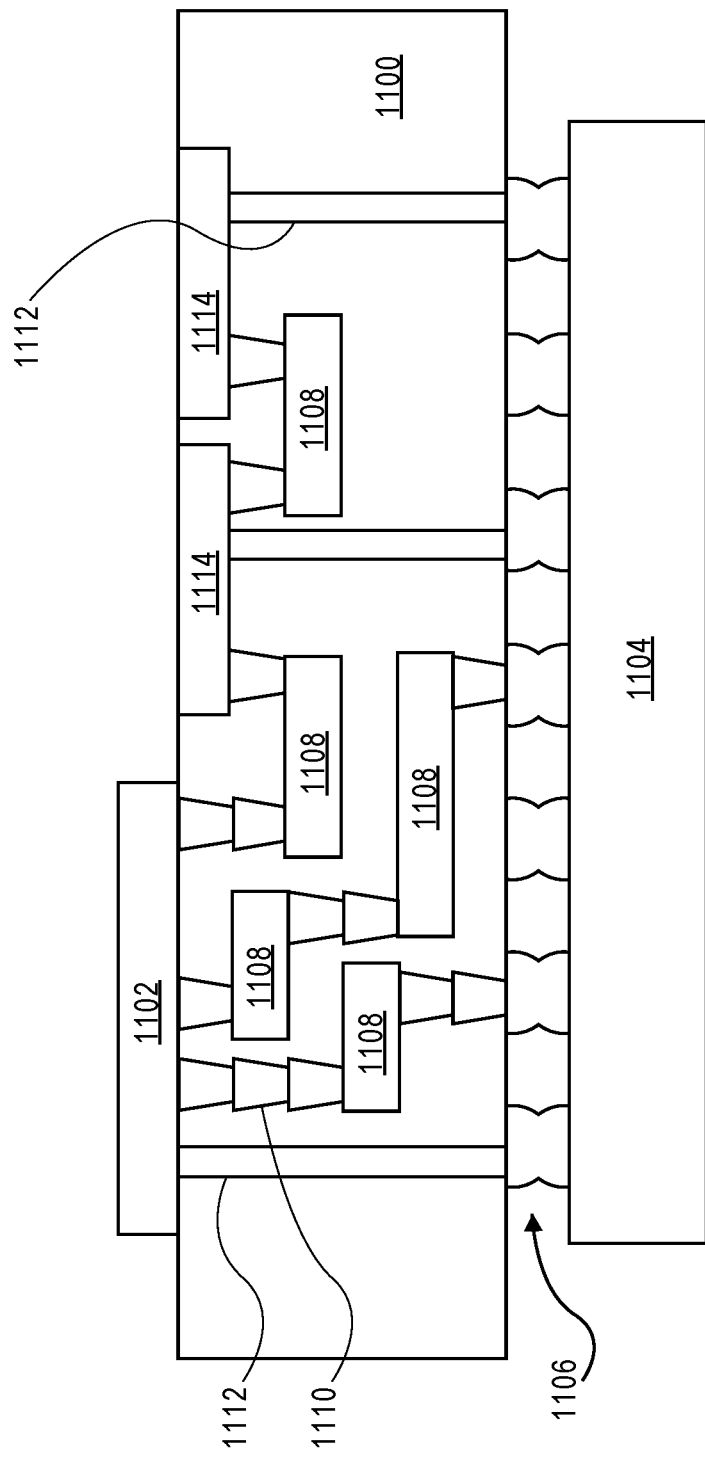
FIG. 11 illustrates an interposer that includes one or more embodiments of the disclosure.

FIG. 11 illustrates an interposer 1100 that includes one or more embodiments of the present disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100 or in the fabrication of components included in the interposer 1100.

Thus, embodiments of the present disclosure include dual self-aligned gate endcap (SAGE) architectures, and methods of fabricating dual self-aligned gate endcap (SAGE) architectures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a first semiconductor fin having a cut along a length of the first semiconductor fin. A second semiconductor fin is parallel with the first semiconductor fin. A first gate endcap isolation structure is between the first semiconductor fin and the second semiconductor fin. A second gate endcap isolation structure is in a location of the cut along the length of the first semiconductor fin. The second endcap isolation structure is parallel with and discrete from the first endcap isolation structure without an intervening semiconductor fin between the first and second endcap isolation structures.

Example Embodiment 2

The integrated circuit structure of example embodiment 1, wherein the second gate endcap isolation structure has a bottom surface above a bottom surface of the first gate endcap isolation structure.

Example Embodiment 3

The integrated circuit structure of example embodiment 1 or 2, further including a third semiconductor fin parallel with the first and second semiconductor fins, the third semiconductor fin spaced apart from the second gate endcap isolation structure by a first spacing at a side of the second gate endcap isolation structure opposite the first gate endcap isolation structure, wherein the second semiconductor fin is spaced apart from the first gate endcap isolation structure by a second spacing less than the first spacing.

Example Embodiment 4

The integrated circuit structure of example embodiment 1, 2 or 3, wherein the first gate endcap isolation structure has a first substantially uniform width along the lengths of the first and second semiconductor fins, and wherein the second gate endcap isolation structure has a second substantially uniform width along the lengths of the first and second semiconductor fins.

Example Embodiment 5

The integrated circuit structure of example embodiment 4, wherein the second substantially uniform width is greater than the first substantially uniform width.

Example Embodiment 6

The integrated circuit structure of example embodiment 1, 2, 3, 4 or 5, wherein one or both of the first or second gate endcap isolation structure includes a lower dielectric portion and a dielectric cap on the lower dielectric portion.

Example Embodiment 7

The integrated circuit structure of example embodiment 1, 2, 3, 4, 5 or 6, wherein one or both of the first or second gate endcap isolation structure includes a vertical seam centered within the one or both of the first or second gate endcap isolation structure.

Example Embodiment 8

The integrated circuit structure of example embodiment 1, 2, 3, 4, 5, 6 or 7, wherein the first gate endcap isolation structure has a total composition different than a total composition of the second gate endcap isolation structure.

Example Embodiment 9

An integrated circuit structure includes a first semiconductor fin having a cut along a length of the first semiconductor fin. A second semiconductor fin is parallel with the first semiconductor fin. A first gate endcap isolation structure is between the first semiconductor fin and the second semiconductor fin. A second gate endcap isolation structure is in a location of the cut along the length of the first semiconductor fin. The second gate endcap isolation structure has a bottom surface above a bottom surface of the first gate endcap isolation structure.

Example Embodiment 10

The integrated circuit structure of example embodiment 9, further including a third semiconductor fin parallel with the first and second semiconductor fins. The third semiconductor fin is spaced apart from the second gate endcap isolation structure by a first spacing at a side of the second gate endcap isolation structure opposite the first gate endcap isolation structure. The second semiconductor fin is spaced apart from the first gate endcap isolation structure by a second spacing less than the first spacing.

Example Embodiment 11

The integrated circuit structure of example embodiment 9 or 10, wherein the first gate endcap isolation structure has a first substantially uniform width along the lengths of the first and second semiconductor fins, and wherein the second gate endcap isolation structure has a second substantially uniform width along the lengths of the first and second semiconductor fins.

Example Embodiment 12

The integrated circuit structure of example embodiment 11, wherein the second substantially uniform width is greater than the first substantially uniform width.

Example Embodiment 13

The integrated circuit structure of example embodiment 9, 10, 11 or 12, wherein one or both of the first or second gate endcap isolation structure includes a lower dielectric portion and a dielectric cap on the lower dielectric portion.

Example Embodiment 14

The integrated circuit structure of example embodiment 9, 10, 11, 12 or 13, wherein one or both of the first or second gate endcap isolation structure includes a vertical seam centered within the one or both of the first or second gate endcap isolation structure.

Example Embodiment 15

The integrated circuit structure of example embodiment 9, 10, 11, 12, 13 or 14, wherein the first gate endcap isolation structure has a total composition different than a total composition of the second gate endcap isolation structure.

Example Embodiment 16

An integrated circuit structure includes a first semiconductor fin having a cut along a length of the first semiconductor fin. A second semiconductor fin is parallel with the first semiconductor fin. A first gate endcap isolation structure is between the first semiconductor fin and the second semiconductor fin. A second gate endcap isolation structure is in a location of the cut along the length of the first semiconductor fin. A third semiconductor fin is parallel with the first and second semiconductor fins. The third semiconductor fin is spaced apart from the second gate endcap isolation structure by a first spacing at a side of the second gate endcap isolation structure opposite the first gate endcap isolation structure. The second semiconductor fin is spaced apart from the first gate endcap isolation structure by a second spacing less than the first spacing.

Example Embodiment 17

The integrated circuit structure of example embodiment 16, wherein the first gate endcap isolation structure has a first substantially uniform width along the lengths of the first and second semiconductor fins, and wherein the second gate endcap isolation structure has a second substantially uniform width along the lengths of the first and second semiconductor fins.

Example Embodiment 18

The integrated circuit structure of example embodiment 17, wherein the second substantially uniform width is greater than the first substantially uniform width.

Example Embodiment 19

The integrated circuit structure of example embodiment 16, 17 or 18, wherein one or both of the first or second gate endcap isolation structure includes a lower dielectric portion and a dielectric cap on the lower dielectric portion.

Example Embodiment 20

The integrated circuit structure of example embodiment 16, 17, 18 or 19, wherein one or both of the first or second gate endcap isolation structure includes a vertical seam centered within the one or both of the first or second gate endcap isolation structure.

Example Embodiment 21

The integrated circuit structure of example embodiment 16, 17, 18, 19 or 20, wherein the first gate endcap isolation structure has a total composition different than a total composition of the second gate endcap isolation structure.

What is claimed is:
1. An integrated circuit structure, comprising:
a first semiconductor fin having a cut along a length of the first semiconductor fin;
a second semiconductor fin parallel with the first semiconductor fin;
a first gate endcap isolation structure between the first semiconductor fin and the second semiconductor fin; and
a second gate endcap isolation structure in a location of the cut along the length of the first semiconductor fin, the second endcap isolation structure parallel with and discrete from the first endcap isolation structure without an intervening semiconductor fin between the first and second endcap isolation structures, wherein the second gate endcap isolation structure is spaced apart from and is not in contact with the first semiconductor fin.
2. The integrated circuit structure of claim 1, wherein the second gate endcap isolation structure has a bottom surface above a bottom surface of the first gate endcap isolation structure.
3. The integrated circuit structure of claim 1, further comprising:
a third semiconductor fin parallel with the first and second semiconductor fins, the third semiconductor fin spaced apart from the second gate endcap isolation structure by a first spacing at a side of the second gate endcap isolation structure opposite the first gate endcap isolation structure, wherein the second semiconductor fin is spaced apart from the first gate endcap isolation structure by a second spacing less than the first spacing.
4. The integrated circuit structure of claim 1, wherein the first gate endcap isolation structure has a first substantially uniform width along the lengths of the first and second semiconductor fins, and wherein the second gate endcap isolation structure has a second substantially uniform width along the lengths of the first and second semiconductor fins.
5. The integrated circuit structure of claim 4, wherein the second substantially uniform width is greater than the first substantially uniform width.
6. The integrated circuit structure of claim 1, wherein one or both of the first or second gate endcap isolation structure comprises a lower dielectric portion and a dielectric cap on the lower dielectric portion.
7. The integrated circuit structure of claim 1, wherein one or both of the first or second gate endcap isolation structure comprises a vertical seam centered within the one or both of the first or second gate endcap isolation structure.
8. The integrated circuit structure of claim 1, wherein the first gate endcap isolation structure has a total composition different than a total composition of the second gate endcap isolation structure.
9. An integrated circuit structure, comprising:
a first semiconductor fin having a cut along a length of the first semiconductor fin;
a second semiconductor fin parallel with the first semiconductor fin;
a first gate endcap isolation structure between the first semiconductor fin and the second semiconductor fin; and
a second gate endcap isolation structure in a location of the cut along the length of the first semiconductor fin, wherein the second gate endcap isolation structure has a bottom surface above a bottom surface of the first gate endcap isolation structure, and wherein the second gate endcap isolation structure is spaced apart from and is not in contact with the first semiconductor fin.
10. The integrated circuit structure of claim 9, further comprising:
a third semiconductor fin parallel with the first and second semiconductor fins, the third semiconductor fin spaced apart from the second gate endcap isolation structure by a first spacing at a side of the second gate endcap isolation structure opposite the first gate endcap isolation structure, wherein the second semiconductor fin is spaced apart from the first gate endcap isolation structure by a second spacing less than the first spacing.
11. The integrated circuit structure of claim 9, wherein the first gate endcap isolation structure has a first substantially uniform width along the lengths of the first and second semiconductor fins, and wherein the second gate endcap isolation structure has a second substantially uniform width along the lengths of the first and second semiconductor fins.
12. The integrated circuit structure of claim 11, wherein the second substantially uniform width is greater than the first substantially uniform width.
13. The integrated circuit structure of claim 9, wherein one or both of the first or second gate endcap isolation structure comprises a lower dielectric portion and a dielectric cap on the lower dielectric portion.

14. The integrated circuit structure of claim 9, wherein one or both of the first or second gate endcap isolation structure comprises a vertical seam centered within the one or both of the first or second gate endcap isolation structure.

15. The integrated circuit structure of claim 9, wherein the first gate endcap isolation structure has a total composition different than a total composition of the second gate endcap isolation structure.

16. An integrated circuit structure, comprising:
a first semiconductor fin having a cut along a length of the first semiconductor fin;
a second semiconductor fin parallel with the first semiconductor fin;
a first gate endcap isolation structure between the first semiconductor fin and the second semiconductor fin; and
a second gate endcap isolation structure in a location of the cut along the length of the first semiconductor fin, wherein the second gate endcap isolation structure is spaced apart from and is not in contact with the first semiconductor fin; and
a third semiconductor fin parallel with the first and second semiconductor fins, the third semiconductor fin spaced apart from the second gate endcap isolation structure by a first spacing at a side of the second gate endcap isolation structure opposite the first gate endcap isolation structure, wherein the second semiconductor fin is spaced apart from the first gate endcap isolation structure by a second spacing less than the first spacing.

17. The integrated circuit structure of claim 16, wherein the first gate endcap isolation structure has a first substantially uniform width along the lengths of the first and second semiconductor fins, and wherein the second gate endcap isolation structure has a second substantially uniform width along the lengths of the first and second semiconductor fins.

18. The integrated circuit structure of claim 17, wherein the second substantially uniform width is greater than the first substantially uniform width.

19. The integrated circuit structure of claim 16, wherein one or both of the first or second gate endcap isolation structure comprises a lower dielectric portion and a dielectric cap on the lower dielectric portion.

20. The integrated circuit structure of claim 16, wherein one or both of the first or second gate endcap isolation structure comprises a vertical seam centered within the one or both of the first or second gate endcap isolation structure.

21. The integrated circuit structure of claim 16, wherein the first gate endcap isolation structure has a total composition different than a total composition of the second gate endcap isolation structure.

* * * * *